United States Patent
Mizutani et al.

(10) Patent No.: US 7,645,557 B2
(45) Date of Patent: Jan. 12, 2010

(54) POSITIVE RESIST COMPOSITION FOR IMMERSION EXPOSURE AND PATTERN FORMING METHOD USING THE SAME

(75) Inventors: Kazuyoshi Mizutani, Shizuoka (JP); Hiromi Kanda, Shizuoka (JP); Haruki Inabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 42 days.

(21) Appl. No.: 11/524,284

(22) Filed: Sep. 21, 2006

(65) Prior Publication Data

US 2007/0065753 A1 Mar. 22, 2007

(30) Foreign Application Priority Data

Sep. 22, 2005 (JP) .......................... P2005-276529

(51) Int. Cl.
*G03F 7/00* (2006.01)
*G03F 7/004* (2006.01)

(52) U.S. Cl. ................. 430/270.1; 420/281.1; 420/311; 420/905; 420/913

(58) Field of Classification Search .............. 430/270.1, 430/905, 281.1, 913, 311
See application file for complete search history.

(56) References Cited

U.S. PATENT DOCUMENTS

| 6,788,477 B2 * | 9/2004 | Lin .............................. 359/820 |
| 6,881,531 B2 * | 4/2005 | Matsuzawa ............... 430/270.1 |
| 6,927,010 B2 * | 8/2005 | Matsuzawa ............... 430/270.1 |
| 2002/0081520 A1 | 6/2002 | Sooriyakumaran et al. |
| 2005/0014090 A1 | 1/2005 | Hirayama et al. |
| 2005/0186501 A1 | 8/2005 | Kishimura et al. |
| 2006/0246373 A1 | 11/2006 | Wang |
| 2008/0193872 A1 | 8/2008 | Caporale et al. |

FOREIGN PATENT DOCUMENTS

| EP | 1142928 A1 * | 10/2001 |
| EP | 1500977 A1 * | 1/2005 |
| JP | 57-153433 A | 9/1982 |
| JP | 7-220990 A | 8/1995 |
| JP | 10-303114 A | 11/1998 |
| JP | 2005-128455 A | 5/2005 |
| JP | 2005-208509 A | 8/2005 |
| JP | 2005-234178 A | 9/2005 |
| JP | 2005-234330 A | 9/2005 |

OTHER PUBLICATIONS

B.J. Lin, "Semiconductor Foundry, Lithography, and Partners" Proceedings of Society of Photo-Optical Instrumentation Engineers (Proc. SPIE) vol. 4688, p. 11 (2002).
J.A. Hoffnagle, et al. "Liquid Immersion Deep-Ultraviolet Interferometric Lithography" J. Vac. Sci. Technology B, 17 (6), (1999), pp. 3306-3309.
XP-002416204, Derwent Publications Ltd., (2004)—Abstract of JP-A-2001-051418.
European Search Report dated Feb. 13, 2007.

* cited by examiner

*Primary Examiner*—Amanda C. Walke
(74) *Attorney, Agent, or Firm*—Sughrue Mion, PLLC

(57) ABSTRACT

A positive resist composition, comprising: (A) a compound capable of generating an acid upon irradiation with actinic rays or radiation; (B) a resin having a repeating unit containing at least one alicyclic structure, of which solubility in an alkali developer increases under an action of an acid; and (C) an alkali-soluble resin having a siloxane bond as a main chain.

14 Claims, 1 Drawing Sheet

POSITIVE RESIST COMPOSITION FOR IMMERSION EXPOSURE AND PATTERN FORMING METHOD USING THE SAME

FIELD OF THE INVENTION

The present invention relates to a positive resist composition for use in the production process of a semiconductor such as IC, in the production of a circuit substrate of liquid crystal, thermal head or the like, and in the lithography process of other photographic applications, and a pattern forming method using the same. More specifically, the present invention relates to a positive resist composition suitable for exposure by an immersion-type projection exposure apparatus using a light source of emitting far ultraviolet light at a wavelength of 300 nm or less, and a pattern forming method using the same.

BACKGROUND OF THE INVENTION

Along with the miniaturization of semiconductor devices, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, the resolving power and the focal depth can be expressed by the following formulae:

(Resolving power)=$k_1 \cdot (\lambda/NA)$ (Focal depth)=$\pm k_2 \cdot \lambda/NA^2$ wherein $\lambda$ is the wavelength of the exposure light source, NA is the numerical aperture of the projection lens, and $k_1$ and $k_2$ are constants related to the process.

In order to realize still shorter wavelength and higher resolving power, studies are being made on an exposure machine where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus and the resist each assured of sufficiently high performance and stability within a required time period.

Conventionally, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that the wavelength of exposure light in air is $\lambda_0$, the refractive index of the immersion liquid to air is n, the convergence half-angle of beam is $\theta$ and $NA_0=\sin \theta$, the above-described resolving power and focal depth when immersed can be expressed by the following formulae:

(Resolving power)=$k_1 \cdot (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion.

This is effective for all pattern profiles and can be combined with super-resolution techniques such as phase-shift method and modified illumination method which are being studied at present.

The apparatus where this effect is applied to the transfer of a fine pattern of a semiconductor device is described, for example, in JP-A-57-153433 (the term "JP-A" as used herein means an "unexamined published Japanese patent application") and JP-A-7-220990, but these references are silent on the resist suitable for the immersion exposure technique.

JP-A-10-303114 indicates that change in the refractive index of immersion liquid brings about deterioration of the projected image due to wavefront aberration of the exposure machine and therefore, the control of refractive index of the immersion liquid is important, and discloses a technique of controlling the temperature coefficient of refractive index of the immersion liquid to a certain range or using, as a suitable immersion liquid, water where the surface tension is decreased or an additive for increasing the surface activity is added. However, this reference does not disclose the additive or is also silent on the resist suitable for the immersion exposure technique.

Recent progress of the immersion exposure technique is reported, for example, in *Proceedings of Society of Photo-Optical Instrumentation Engineers* (*Proc. SPIE*), Vol. 4688, page 11 (2002) and *J. Vac. Sci. Tecnol. B*, 17 (1999). In the case of using an ArF excimer laser as the light source, in view of safety on handling as well as transmittance and refractive index at 193 nm, pure water (refractive index at 193 nm: 1.44) is considered to be a most promising immersion liquid.

In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of a resist for a KrF excimer laser (248 nm), an image forming method called chemical amplification is used as the image forming method for a resist so as to compensate the reduction in the sensitivity due to light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by an alkali developer.

In the immersion exposure, the resist film is exposed through a photomask in the state of an immersion liquid being filled between the resist film and the optical lens to thereby transfer the pattern of the photomask to the resist film, and it is estimated that the immersion liquid permeates into the inside of the resist film and affects the resist performance.

When a chemical amplification resist is applied to the immersion exposure technique, the acid on the resist surface generated upon exposure moves to the immersion liquid and the acid concentration on the surface of exposed area is changed. This may be considered to have a close resemblance to the acid deactivation occurring on the surface of exposed area due to basic contamination in a very small amount on the order of several ppb mingled from the environment at the time delay between exposure and PEB (PED: post-exposure time delay), which is a serious problem at the initiation of development of the chemical amplification-type positive resist, but the effect of immersion exposure on the resist or the mechanism thereof is not clearly known.

On the other hand, it has been found that when a chemical amplification-type resist causing no problem in the lithography by normal exposure is used for the pattern formation by the immersion exposure, there arises a problem such as generation of development defect or development residue (scum) or elution of the resist into the immersion liquid.

SUMMARY OF THE INVENTION

By taking account of these problems in conventional techniques, an object of the present invention is to provide a positive resist composition suitable for immersion exposure ensuring that in the pattern formation by immersion exposure, generation of development defect and scum is suppressed and the resist component is less dissolved out into the immersion liquid, and a pattern forming method using the composition.

The present invention provides a positive resist composition for immersion exposure having the following constitutions and a pattern forming method using the composition and by these composition and method, the above-described object of the present invention is achieved.

<1> A positive resist composition, comprising:

(A) a compound capable of generating an acid upon irradiation with actinic rays or radiation, (B) a resin having a repeating unit containing at least one alicyclic structure, of which solubility in an alkali developer increases under the action of an acid, and (C) an alkali-soluble resin having a siloxane bond as the main chain.

<2> The positive resist composition as described in <1> above, wherein the (C) alkali-soluble resin having a siloxane bond as the main chain has a fluorine atom-containing group in the side chain.

<3> The positive resist composition as described in <2> above, wherein in the (C) alkali-soluble resin having a siloxane bond as the main chain, the fluorine atom is present as a substituent on the carbon atom bonded by a hydroxyl group or as a substituent on the carbon atom adjacent to the carbon atom bonded by a hydroxyl group.

<4> A pattern forming method comprising steps of forming a resist film from the resist composition described in any one of <1> to <3> above, and immersion exposing and developing the resist film.

According to the present invention, a positive resist composition suitable for immersion exposure ensuring that generation of development defect and scum and elution of the resist component into the immersion liquid are suppressed at the immersion exposure, and a pattern forming method using the composition can be provided.

DETAILED DESCRIPTION OF THE INVENTION

Figure 1:
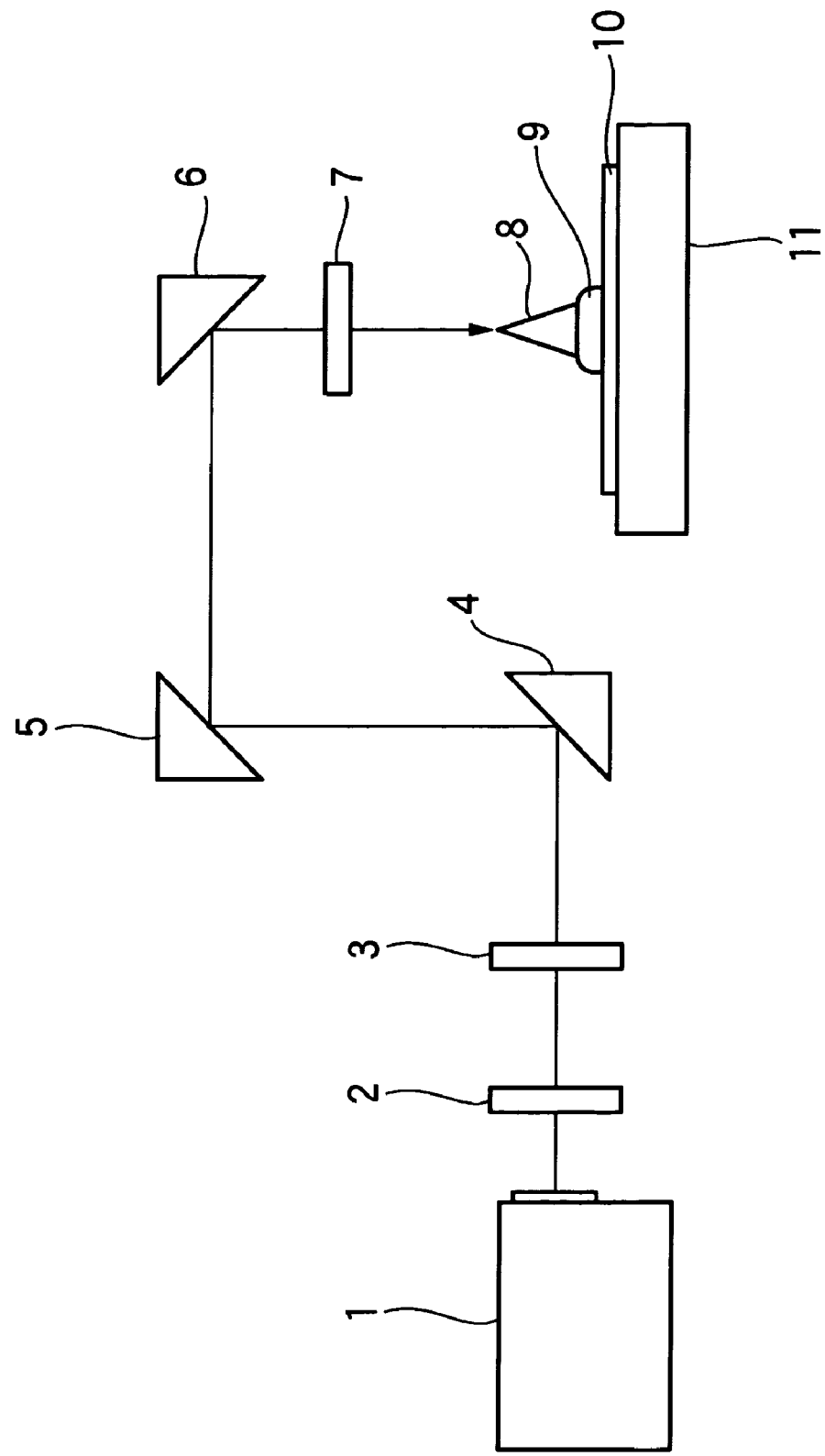
FIG. 1 is a view schematically showing a two-beam interference exposure testing apparatus.

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin capable of decomposing under the action of an acid to increase the solubility in an alkali developer (sometimes referred to as an "acid-decomposable resin (A))"

The resin for use in the chemical amplification-type resist film for immersion exposure of the present invention is a resin having a monocyclic or polycyclic alicyclic hydrocarbon structure and being capable of decomposing under the action of an acid to increase the solubility in an alkali developer (acid-decomposable resin), and this is a resin where a group capable of decomposing under the action of an acid to produce an alkali-soluble group (hereinafter sometimes referred to as an "acid-decomposable group") is present in either one or both of the main chain and the side chain of the resin. The resin of the present invention can be suitably used particularly for ArF immersion exposure.

Examples of the alkali-soluble group include a carboxyl group, a hydroxyl group and a sulfonic acid group.

The group capable of decomposing under the action of an acid is preferably a group resulting from substituting the hydrogen atom of a —COOH group by a group which splits off by the effect of an acid.

Preferred examples of the acid-decomposable group include a cumyl ester group, an enol ether group, an acetal ester group and a tertiary alkyl ether group, with a tertiary alkyl ester group being more preferred.

The resin contained in the positive resist composition for immersion exposure of the present invention is preferably a resin having a group represented by the following formula (I) as the group capable of decomposing under the action of an acid to produce an alkali-soluble group (acid-decomposable group).

(I)

In formula (I), $R_1$ to $R_3$ each independently represents an alkyl group, a cycloalkyl group or an alkenyl group. At least two members out of $R_1$ to $R_3$ may combine to form a ring.

The alkyl group of $R_1$ to $R_3$ is preferably an alkyl group having a carbon number of 1 to 8, and examples thereof include a methyl group, an ethyl group, a propyl group, an n-butyl group, a sec-butyl group, a 2-hexyl group and an octyl group.

The cycloalkyl group of $R_1$ to $R_3$ may be monocyclic or polycyclic and specific examples include a group having a carbon number of 5 or more and having a monocyclo, bicyclo, tricyclo or tetracyclo structure or the like. The carbon number thereof is preferably from 6 to 30, more preferably from 7 to 25.

Preferred examples of the cycloalkyl group of $R_1$ to $R_3$ include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group. Incidentally, a part of the hydrocarbon in the cycloalkyl group may be substituted by a heteroatom such as oxygen atom.

The alkenyl group or $R_1$ to $R_3$ is preferably an alkenyl group having a carbon number of 2 to 8, and examples thereof include a vinyl group, an allyl group, a butenyl group and a cyclohexenyl group.

The alkyl group, cycloalkyl group and alkenyl group in $R_1$ to $R_3$ each may have a substituent. Examples of the substituent include an alkyl group, a halogen atom, a hydroxyl group, an alkoxy group, a carboxyl group, an alkoxycarbonyl group, a cyano group and an ester group. The alkyl group is preferably a lower alkyl group such as methyl group, ethyl group, propyl group, isopropyl group and butyl group, more preferably a methyl group, an ethyl group, a propyl group or an isopropyl group. The alkoxy group includes an alkoxy group having a carbon number of 1 to 4, such as methoxy group, ethoxy group, propoxy group and butoxy group. The alkyl group and alkoxy group each may further have a substituent. Examples of the substituent which the alkyl group and alkoxy group may have include a hydroxyl group, a halogen atom and an alkoxy group.

At least two members out of $R_1$ to $R_3$ may combine with each other to form a ring and in this case, may combine through a heteroatom such as oxygen atom.

The repeating unit having a group represented by formula (I) may be any repeating unit but is preferably a repeating unit represented by the following formula (pA):

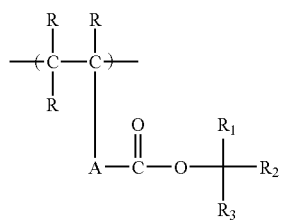

(pA)

In formula (pA), R represents a hydrogen atom, a halogen atom or an alkyl group having a carbon number of 1 to 4, and a plurality of R's may be the same or different.

A represents a single bond, or sole group or a combination of two or more groups, selected from the group consisting of an alkylene group, an ether group, a thioether group, a carbonyl group, an ester group, an amido group, a sulfonamido group, a urethane group and a urea group. The alkylene group may have a substituent.

$R_1$ to $R_3$ have the same meanings as $R_1$ to $R_3$ in formula (I).

The repeating unit represented by formula (pA) is most preferably a repeating unit by 2-alkyl-2-adamantyl (meth)acrylate or dialkyl(1-adamantyl)methyl (meth)acrylate.

Specific examples of the repeating unit represented by formula (pA) are set forth below.

(In formulae, Rx represents H, $CH_3$ or $CF_3$.)

1

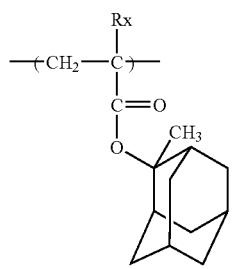

2

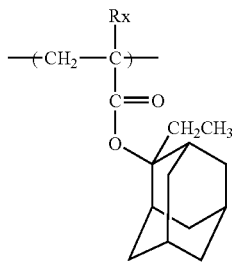

3

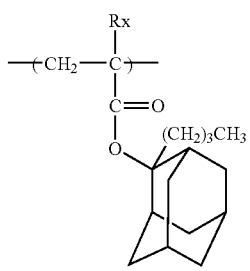

4

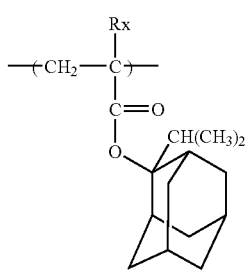

5

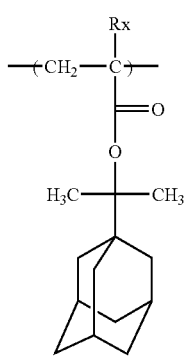

6

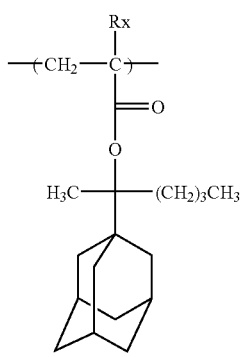

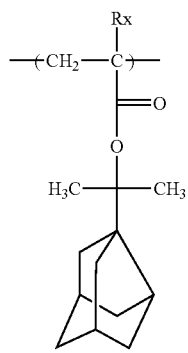
7
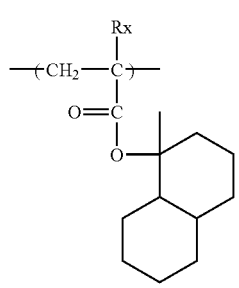
8
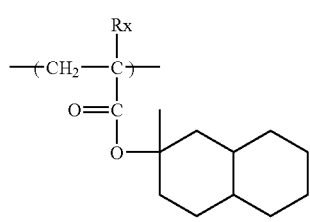
9
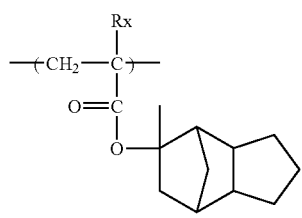
10
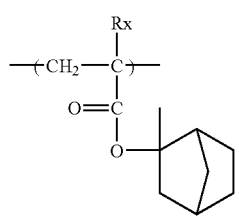
11
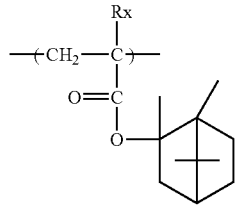
12
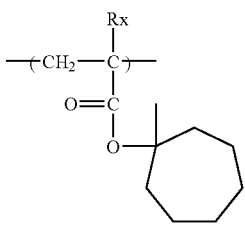
13
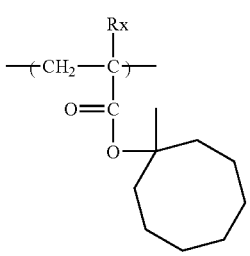
14
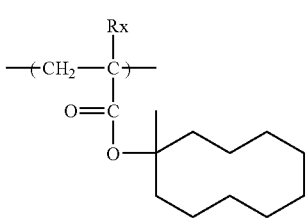
15
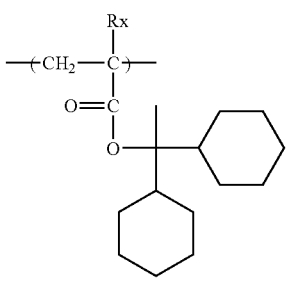
16
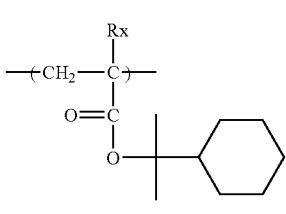
17
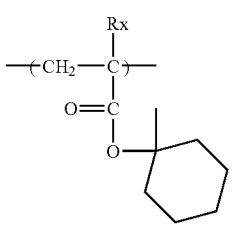
18

-continued

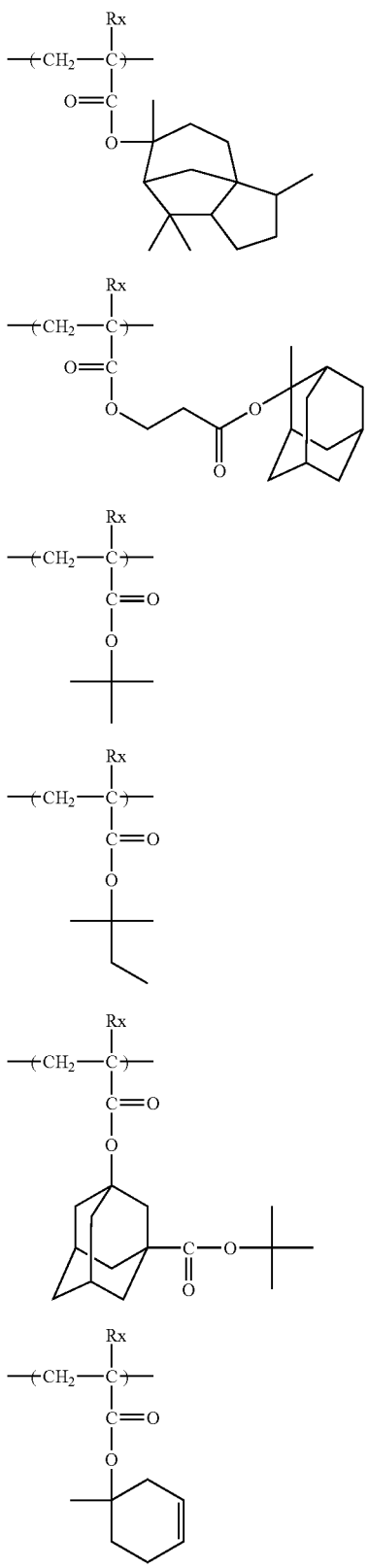

In the (A) acid-decomposable resin, the content of the repeating unit having a group represented by formula (I) is preferably from 10 to 60 mol %, more preferably from 10 to 50 mol %, based on all repeating structural units.

The (A) acid-decomposable resin may have only a group represented by formula (I) as the acid-decomposable group or may contain other acid-decomposable group in combination.

Examples of the other acid-decomposable group which the (A) acid-decomposable resin may have include —O—C($R_{36}$)($R_{37}$)($R_{38}$), —O—C($R_{36}$)($R_{37}$)($OR_{39}$), —O—C(=O)—O—C($R_{36}$)($R_{37}$)($R_{38}$), —O—C($R_{01}$)($R_{02}$)($OR_{39}$), —O—C($R_{01}$)($R_{02}$)—C(=O)—O—C($R_{36}$)($R_{37}$)($R_{38}$).

In the formulae, $R_{36}$ to $R_{39}$ each independently represents an alkyl group, a cycloalkyl group, an aryl group, an aralkyl group or an alkenyl group, and $R_{36}$ and $R_{37}$ or $R_{36}$ and $R_{39}$ may combine with each other to form a ring.

$R_{01}$ and $R_{02}$ each independently represents a hydrogen atom, an alkyl group, a cycloalkyl group, an aryl group, an aralkyl group or an alkenyl group.

Incidentally, —C($R_{36}$)($R_{37}$)($R_{38}$) means a group where the groups represented by $R_{36}$ to $R_{38}$ each is bonded to the carbon atom by a single bond. Hereinafter, the same applies.

In the (A) acid-decomposable resin, the total amount of repeating units having an acid-decomposable group, including a repeating unit having an acid-decomposable group represented by formula (I) and a repeating unit having other acid-decomposable group, is preferably from 10 to 70 mol %, more preferably from 20 to 65 mol %, still more preferably from 25 to 50 mol %, based on all repeating units.

The monocyclic or polycyclic alicylcic hydrocarbon structure contained in the (A) acid-decomposable resin is not particularly limited but includes a cycloalkyl group as $R_1$ to $R_3$ in formula (I) and an alicyclic hydrocarbon structure contained in the repeating unit described later.

The (A) acid-decomposable resin preferably contains, as the repeating unit having a monocyclic or polycyclic alicylcic hydrocarbon structure, at least one repeating unit selected from the group consisting of a repeating unit having an alicyclic hydrocarbon-containing partial structure represented by any one of the following formulae (pI) to (pVI), and a repeating unit represented by the following formula (II-AB).

The alicyclic hydrocarbon-containing partial structure represented by any one of formulae (pI) to (pVI) is described below.

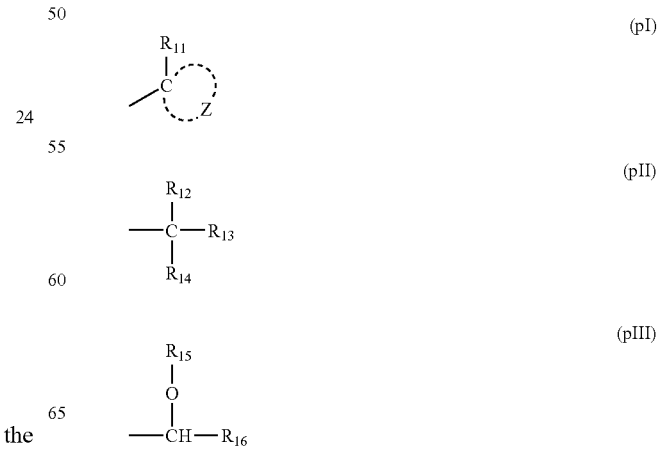

-continued

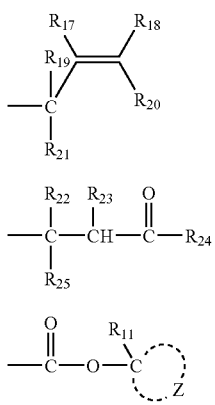

In the formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group and that $R_{23}$ and $R_{24}$ may combine with each other to form a ring.

The alicyclic hydrocarbon group of $R_{11}$ to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These alicyclic hydrocarbon groups each may have a substituent.

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which these alicyclic hydrocarbon groups may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, and the alkyl group is more preferably selected from the group consisting of a methyl group, an ethyl group, a propyl group and an isopropyl group. The alkoxy group includes an alkoxy group having a carbon number of 1 to 4, such as methoxy group, ethoxy group, propoxy group and butoxy group. Examples of the substituent which these alkyl group, alkoxy group and alkoxycarbonyl group may further have include a hydroxyl group, a halogen atom and an alkoxy group.

The structures represented by formulae (pI) to (pVI) can be used for the protection of an alkali-soluble group in the resin. Examples of the alkali-soluble group include various groups known in this technical field.

Specific examples thereof include a carboxylic acid group, a sulfonic acid group, a phenol group and a thiol group, with a carboxylic acid group and a sulfonic acid group being preferred.

Preferred examples of the alkali-soluble group protected by the structure represented by any one of formulae (pI) to (pVI) in the resin include a structure where a hydrogen atom of a carboxyl group is substituted by the structure represented by any one of formulae (pI) to (pVI).

Specific examples of the repeating unit having a structure such that a hydrogen atom of a carboxyl group is substituted by the structure represented by any one of formulae (pI) to (pVI) are the same as those specific examples of the repeating unit represented by formula (pA).

The resin as the component (A) more preferably contains a repeating unit having a group represented by formula (1A).

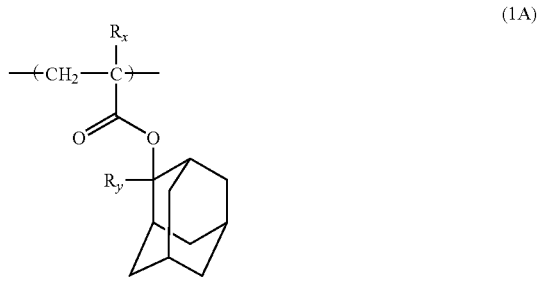

In formula (IA), Rx represents a hydrogen atom or a methyl group.

Ry represents an alkyl group having a carbon number of 1 to 6. The alkyl group having a carbon number of 1 to 6 as Ry may be linear or branched and may or may not have a substituent. Examples of the substituent which the alkyl group may have include an alkoxy group having a carbon number of 1 to 4, a halogen atom (e.g., fluorine, chlorine, bromine, iodine), an acyl group, an acyloxy group, a cyano group, a hydroxyl group, a carboxyl group, an alkoxy-carbonyl group and a nitro group.

Examples of the repeating unit represented by formula (IA) include repeating units derived from 2-methyl-2-adamantyl(meth)acrylate, 2-ethyl-2-adamantyl(meth)acrylate, 2-propyl-2-adamantyl(meth)acrylate, 2-isopropyl-2-adamantyl(meth)acrylate, 2-butyl-2-adamantyl(meth)acrylate and 2-(3-methoxypropyl)-2-adamantyl(meth)acrylate. Among these, preferred are repeating units derived from 2-methyl-2-adamantyl(meth)acrylate and 2-ethyl-2-adamantyl(meth)acrylate.

The repeating unit having an alicyclic structure represented by formula (II-AB) is described below.

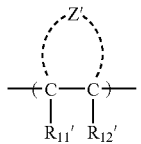
(II-AB)

In formula (II-AB), $R_{11}'$ and $R_{12}'$ each independently represents a hydrogen atom, a cyano group, a halogen atom or an alkyl group, and Z' represents an atomic group for forming an alicyclic structure, containing two bonded carbon atoms (C—C).

The repeating unit represented by formula (II-AB) is preferably a repeating unit represented by the following formula (II-A) or (II-B):

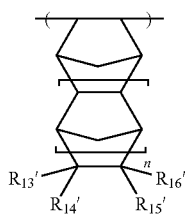
(II-A)

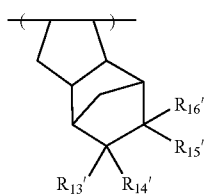
(II-B)

In formulae (II-A) and (II-B), $R_{13}'$ to $R_{16}'$ each independently represents a hydrogen atom, a halogen atom, a hydroxyl group, a cyano group, —COOH, —COOR$_5$, a group capable of decomposing under the action of an acid, —C(=O)—X-A'-R$_{17}'$, an alkyl group or a cyclic hydrocarbon group.

$R_5$ represents an alkyl group, a cyclic hydrocarbon group or a —Y group shown below.

X represents an oxygen atom, a sulfur atom, —NH—, —NHSO$_2$— or —NHSO$_2$NH—.

A' represents a sing bond or a divalent linking group.

At least two members out of $R_{13}'$ to $R_{16}'$ may combine to form a ring. n represents 0 or 1.

$R_{17}'$ represents —COOH, —COOR$_5$, —CN, a hydroxyl group, an alkoxy group, —CO—NH—R$_6$, —CO—NH—SO$_2$—R$_6$ or a —Y group shown below.

$R_6$ represents an alkyl group or a cyclic hydrocarbon group.
—Y group:

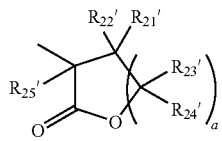 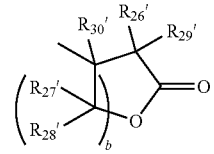

In the —Y group, $R_{21}'$ to $R_{30}'$ each independently represents a hydrogen atom or an alkyl group, and a and b each represents 1 or 2.

In formulae (pI) to (pVI), the alkyl group of $R_{12}$ to $R_{25}$ is a linear or branched alkyl group having from 1 to 4 carbon atoms. Examples of such an alkyl group include a methyl group, an ethyl group, an n-propyl group, an isopropyl group, an n-butyl group, an isobutyl group, a sec-butyl group and a tert-butyl group.

Examples of the substituent which these alkyl groups each may have include an alkoxy group having a carbon number of 1 to 4, a halogen atom (e.g., fluorine, chlorine, bromine, iodine), an acyl group, an acyloxy group, a cyano group, a hydroxyl group, a carboxy group, an alkoxycarbonyl group and a nitro group.

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Examples of the halogen atom in $R_{11}'$ and $R_{12}'$ include a chlorine atom, a bromine atom, a fluorine atom and an iodine atom.

The alkyl group in $R_{11}'$, $R_{12}'$ and $R_{21}'$ to $R_{30}'$ is preferably a linear or branched alkyl group having a carbon number of 1 to 10, more preferably a linear or branched alkyl group having a carbon number of 1 to 6, still more preferably a methyl group, an ethyl group, a propyl group, an isopropyl group, a n-butyl group, an isobutyl group, a sec-butyl group or a tert-butyl group.

Examples of the substituent which the alkyl group may further have include a hydroxyl group, a halogen atom, a carboxyl group, an alkoxy group, an acyl group, a cyano group and an acyloxy group. Examples of the halogen atom include a chlorine atom, a bromine atom, a fluorine atom and an iodine atom, examples of the alkoxy group include an alkoxy group having a carbon number of 1 to 4, such as methoxy group, ethoxy group, propoxy group and butoxy group, examples of the acyl group include a formyl group and an acetyl group, and examples of the acyloxy group include an acetoxy group.

The atomic group for forming an alicyclic structure, represented by Z', is an atomic group for forming a repeating unit of an alicyclic hydrocarbon which may have a substituent, in the resin, and among these atomic groups, preferred is an atomic group for forming a crosslinked alicyclic structure to form a crosslinked alicyclic hydrocarbon repeating unit.

Examples of the skeleton of the alicyclic hydrocarbon formed are the same as those of the alicyclic hydrocarbon group of $R_{11}$ to $R_{25}$ in formulae (pI) to (pVI).

The alicyclic hydrocarbon skeleton may have a substituent, and examples of the substituent include $R_{13}'$ to $R_{16}'$ in formulae (II-A) and (II-B).

Among the repeating units having a crosslinked alicyclic hydrocarbon, the repeating units represented by formulae (II-A) and (II-B) are more preferred.

In the repeating unit represented by formula (II-AB), the acid-decomposable group may be contained in the —C(=O)—X-A'-$R_{17}$' or may be contained as a substituent of the alicyclic structure formed by Z'.

The structure of the acid-decomposable group is represented by —C(=O)—$X_1$—$R_0$.

In this formula, $R_0$ represents, for example, a tertiary alkyl group such as tert-butyl group and tert-amyl group, a 1-alkoxyethyl group such as isoboronyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilylester group, a 3-oxocyclohexylester group, a 2-methyl-2-adamantyl group or a mevalonic lactone residue, and $X_1$ has the same meaning as X above.

Examples of the halogen atom in $R_{13}$' to $R_{16}$' include a chlorine atom, a bromine atom, a fluorine atom and an iodine atom.

The alkyl group in $R_5$, $R_6$ and $R_{13}$' to $R_{16}$' is preferably a linear or branched alkyl group having a carbon number of 1 to 10, more preferably a linear or branched alkyl group having a carbon number of 1 to 6, still more preferably a methyl group, an ethyl group, a propyl group, an isopropyl group, a n-butyl group, an isobutyl group, a sec-butyl group or a tert-butyl group.

The cyclic hydrocarbon group in $R_5$, $R_6$ and $R_{13}$' to $R_{16}$' is, for example, a cyclic alkyl group or a crosslinked hydrocarbon, and examples thereof include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The ring formed by combining at least two members out of $R_{13}$' to $R_{16}$' includes a ring having a carbon number of 5 to 12, such as cyclopentene, cyclohexene, cycloheptane and cyclooctane.

The alkoxy group in $R_{17}$' includes an alkoxy group having a carbon number 1 to 4, such as methoxy group, ethoxy group, propoxy group and butoxy group.

Examples of the substituent which these alkyl group, cyclic hydrocarbon group and alkoxy group may further have include a hydroxyl group, a halogen atom, a carboxyl group, an alkoxy group, an acyl group, a cyano group, an acyloxy group, an alkyl group and a cyclic hydrocarbon group. Examples of the halogen atom include a chlorine atom, a bromine atom, a fluorine atom and an iodine atom, examples of the alkoxy group include an alkoxy group having a carbon number of 1 to 4, such as methoxy group, ethoxy group, propoxy group and butoxy group, examples of the acyl group include a formyl group and an acetyl group, and examples of the acyloxy group include an acetoxy group.

Examples of the alkyl group and cyclic hydrocarbon group include those described above.

The divalent linking group of A' includes a sole group or a combination of two or more groups, selected from the group consisting of an alkylene group, an ether group, a thioether group, a carbonyl group, an ester group, an amido group, a sulfonamido group, a urethane group and a urea group.

Various substituents $R_{13}$' to $R_{16}$' in formulae (II-A) and (II-B) work out to the substituents of an atomic group for forming an alicyclic structure in formula (II-AB) or an atomic group Z for forming a crosslinked alicyclic structure.

Specific examples of the repeating units represented by formulae (II-A) and (II-B) are set forth below, but the present invention is not limited to these specific examples.

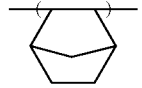

[II-1]

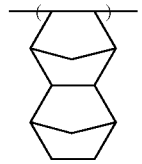

[II-2]

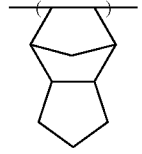

[II-3]

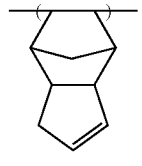

[II-4]

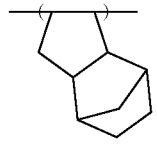

[II-5]

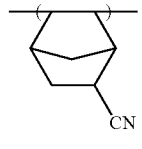

[II-6]

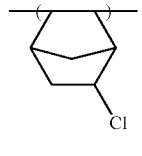

[II-7]

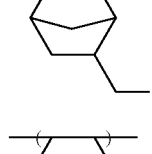

[II-8]

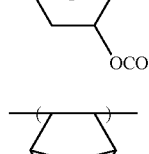

[II-9]

[II-10]

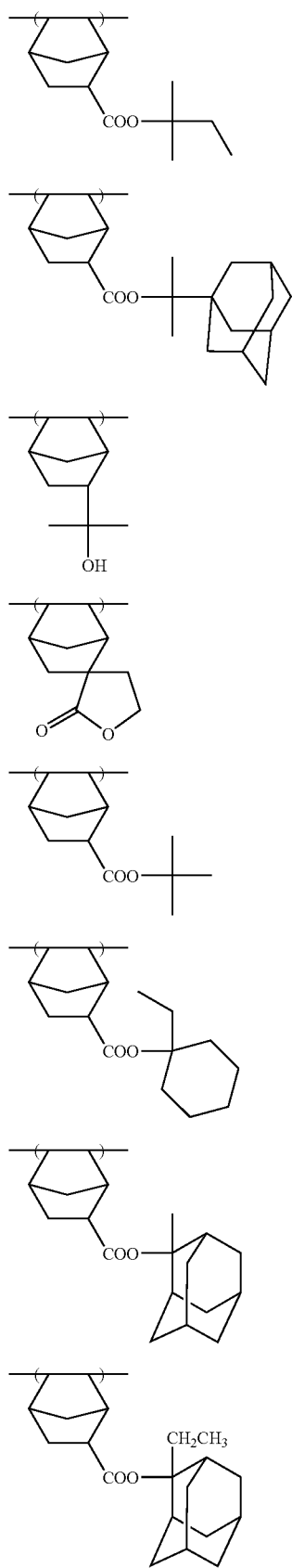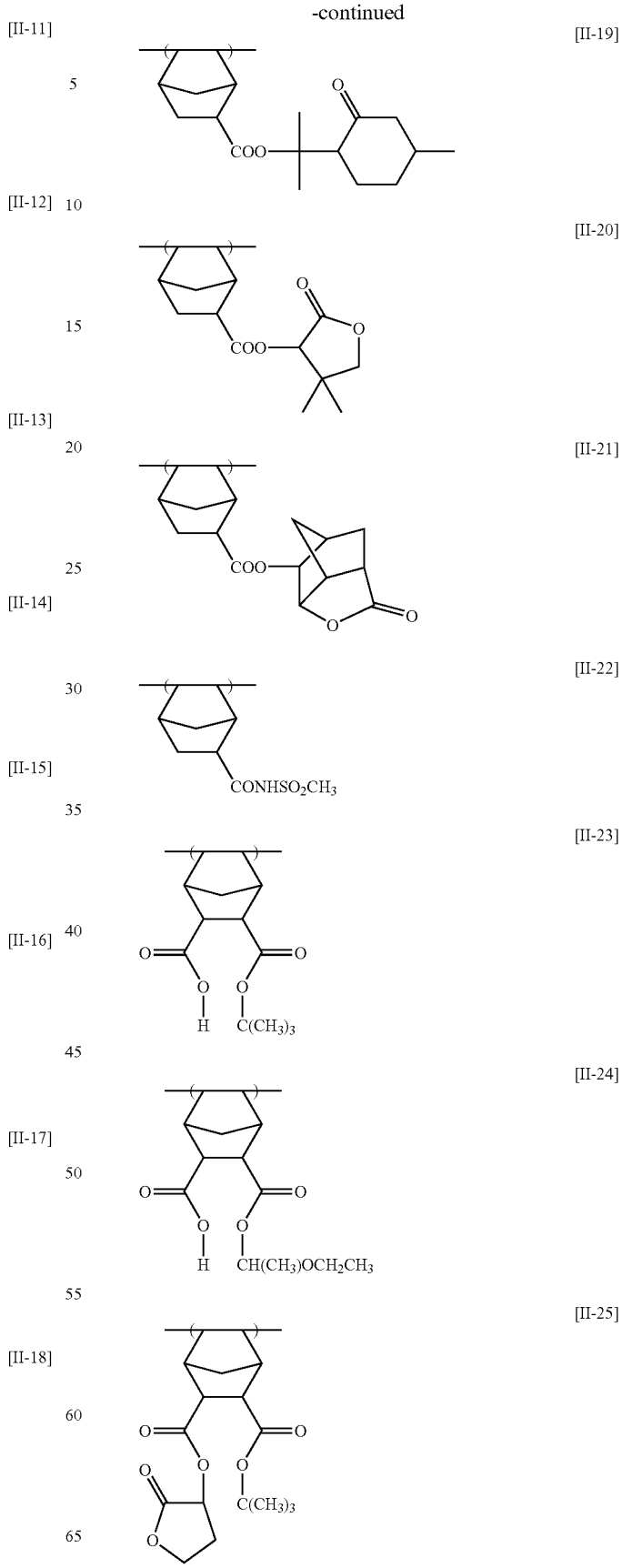

-continued

[II-26] 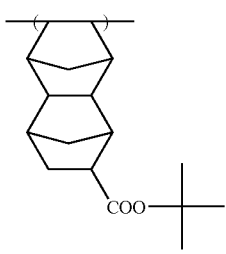

[II-27] 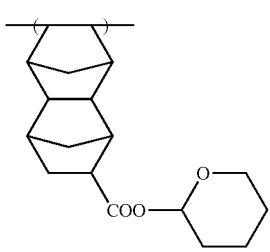

[II-28] 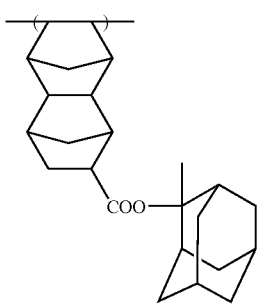

[II-29] 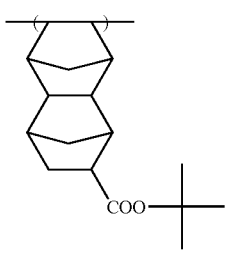

[II-30] 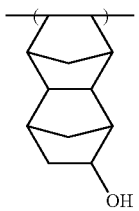

[II-31] 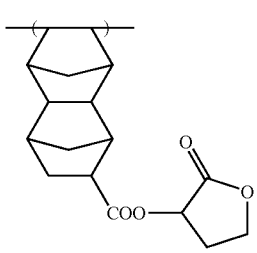

-continued

[II-32] 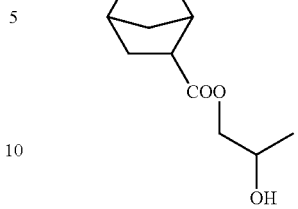

In the (A) acid-decomposable resin, the content of the repeating unit having an alicyclic hydrocarbon-containing partial structure represented by any one of formulae (pI) to (pVI) is preferably from 20 to 70 mol %, more preferably from 24 to 65 mol %, still more preferably from 28 to 60 mol %, based on all repeating structural units.

In the (A) acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the (A) acid-decomposable resin having a monocyclic or polycyclic hydrocarbon structure, the acid-decomposable group represented by formula (I) and other acid-decomposable group may be contained in any repeating unit out of the repeating unit having an alicyclic hydrocarbon-containing partial structure represented by any one of formulae (pI) to (pVI), the repeating unit represented by formula (II-AB), and the repeating unit of a copolymerization component which is described later.

The (A) acid-decomposable resin preferably has a lactone group, more preferably a repeating unit containing a group having a lactone structure represented by the following formulae (Lc) or by any one of (III-1) to (III-5), and the group having a lactone structure may be bonded directly to the main chain.

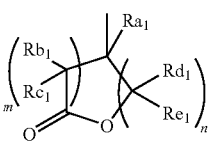 (Lc)

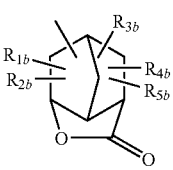 (III-1)

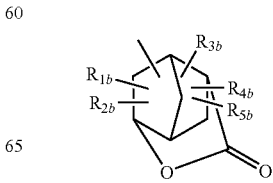 (III-2)

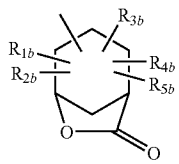
(III-3)

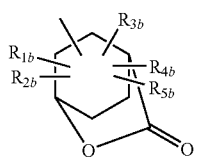
(III-4)

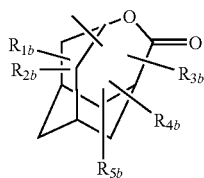
(III-5)

In formula (Lc), $Ra_1$, $Rb_1$, $Rc_1$, $Rd_1$ and $Re_1$ each independently represents a hydrogen atom or an alkyl group, m and n each independently represents an integer of 0 to 3, and m+n is from 2 to 6.

In formulae (III-1) to (III-5), $R_{1b}$ to $R_{5b}$ each independently represents a hydrogen atom, an alkyl group, a cycloalkyl group, an alkoxy group, an alkoxycarbonyl group, an alkylsulfonylimino group or an alkenyl group, and two members out of $R_{1b}$ to $R_{5b}$ may combine to form a ring.

The alkyl group of $Ra_1$ to $Re_1$ in formula (Lc) and the alkyl group in the alkyl group, alkoxy group, alkoxycarbonyl group and alkylsulfonylimino group of $R_{1b}$ to $R_{5b}$ in formulae (III-1) to (III-5) include a linear or branched alkyl group and may have a substituent Preferred examples of the substituent include an alkoxy group having a carbon number of 1 to 4, a halogen atom (e.g., fluorine, chlorine, bromine, iodine), an acyl group having a carbon number of 2 to 5, an acyloxy group having a carbon number of 2 to 5, a cyano group, a hydroxy group, a carboxy group, an alkoxycarbonyl group having a carbon number of 2 to 5, and a nitro group.

Examples of the repeating unit containing a group having a lactone structure represented by formula (Lc) or by any one of formulae (III-1) to (III-5) include a repeating unit where at least one of $R_{13}'$ to $R_{16}'$ in formula (II-A) or (II-B) has a group represented by formula (Lc) or by any one of formulae (III-1) to (III-5) (for example, $R_5$ of —$COOR_5$ is a group represented by formula (Lc) or by any one of formulae (III-1) to (III-5)), and a repeating unit represented by the following formula (AI):

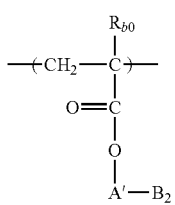
(AI)

In formula (AI), $R_{b0}$ represents a hydrogen atom, a halogen atom or an alkyl group having a carbon number of 1 to 4. Preferred examples of the substituent which the alkyl group of $R_{b0}$ may have include those described above as preferred examples of the substituent which the alkyl group of $R_{1b}$ in formulae (III-1) to (III-5) may have.

Examples of the halogen atom of $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof.

$B_2$ represents a group represented by formula (Lc) or by any one of formulae (III-1) to (III-5).

Specific examples of the repeating unit containing a group having a lactone structure are set forth below, but the present invention is not limited thereto.

(In the formulae, Rx is H, $CH_3$ or $CF_3$.)

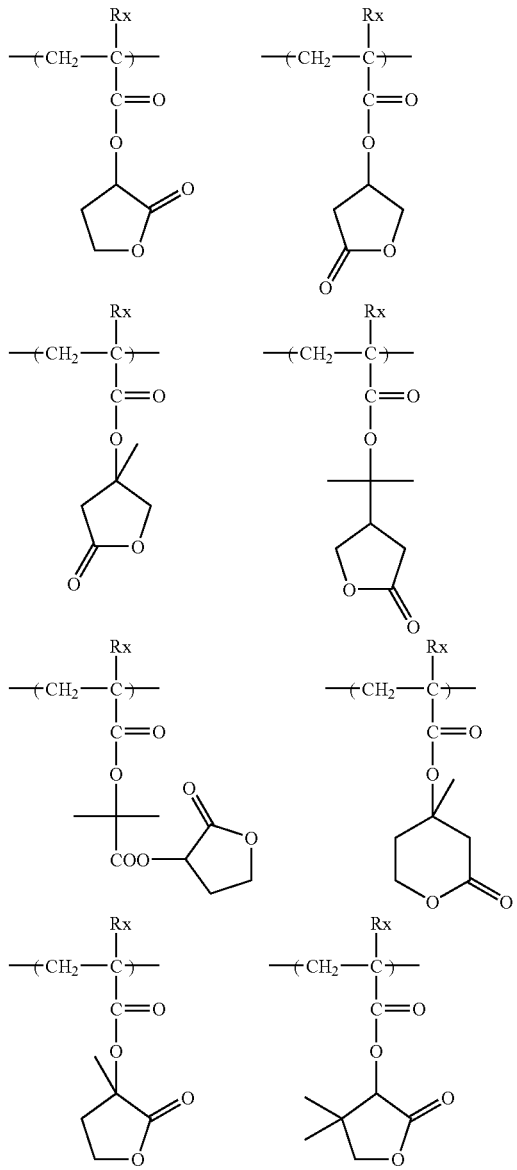

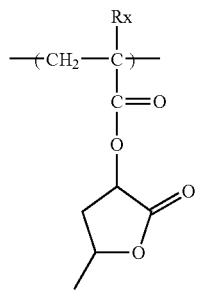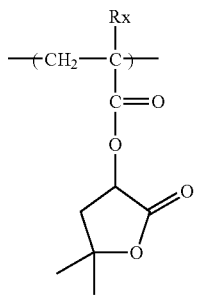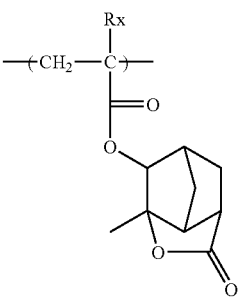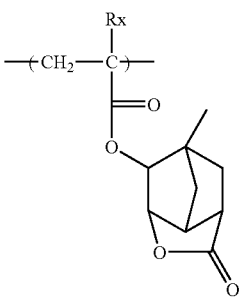
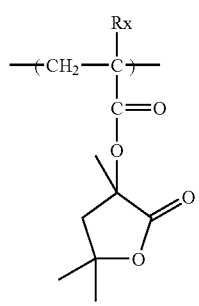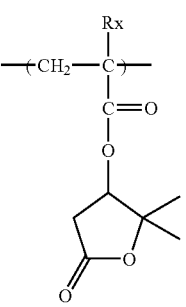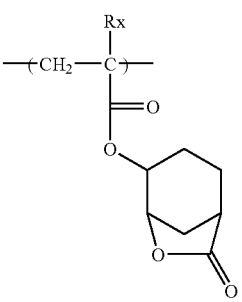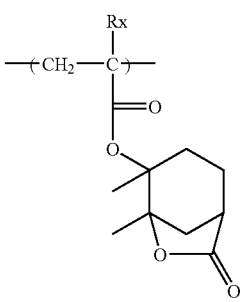
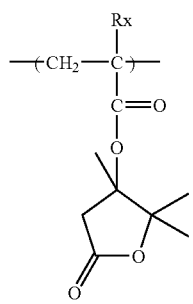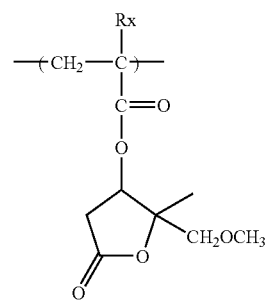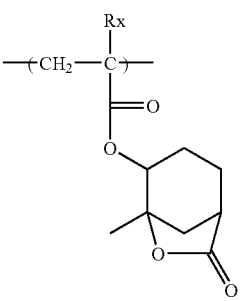
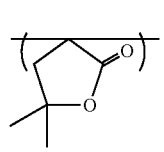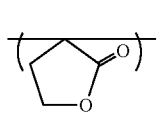
(In the formulae, Rx is H, CH₃ or CF₃.)
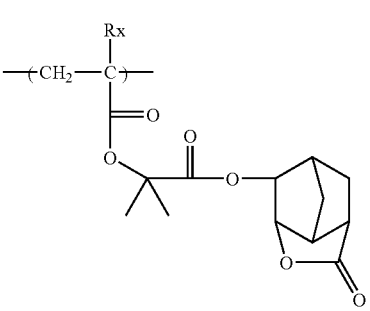
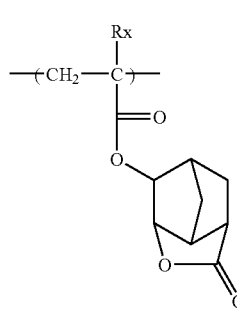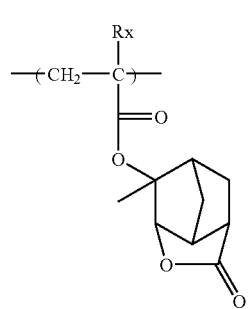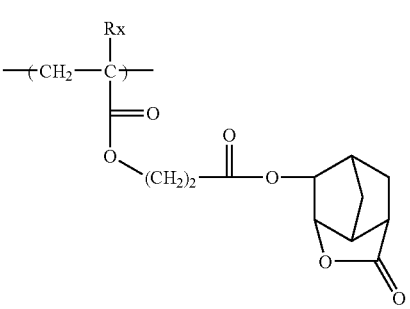

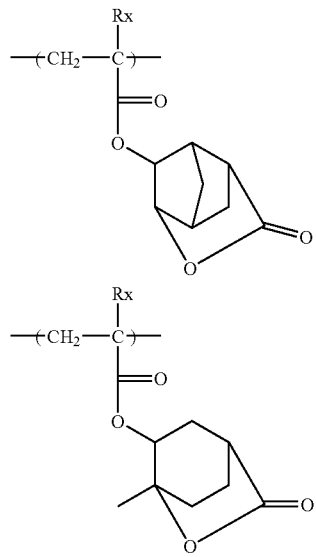

(In the formulae, Rx is H, CH₃ or CF₃.)

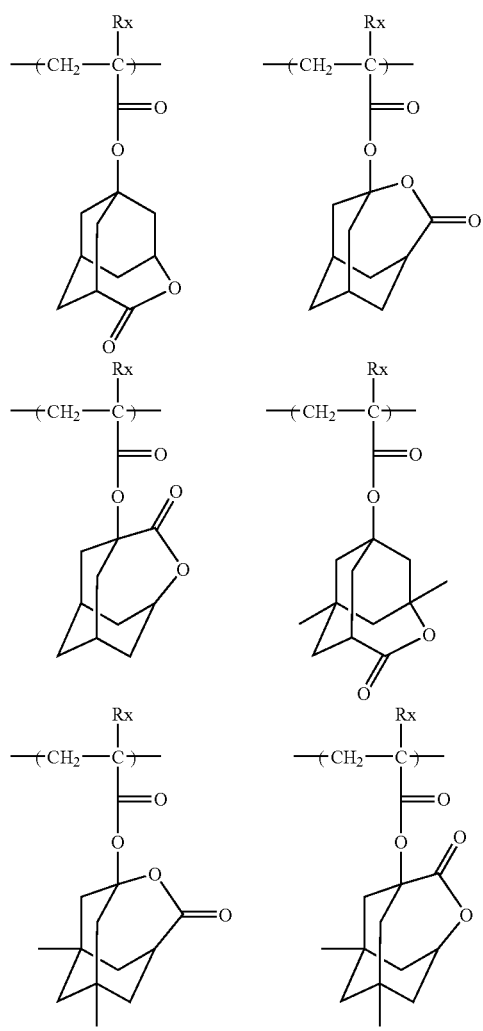

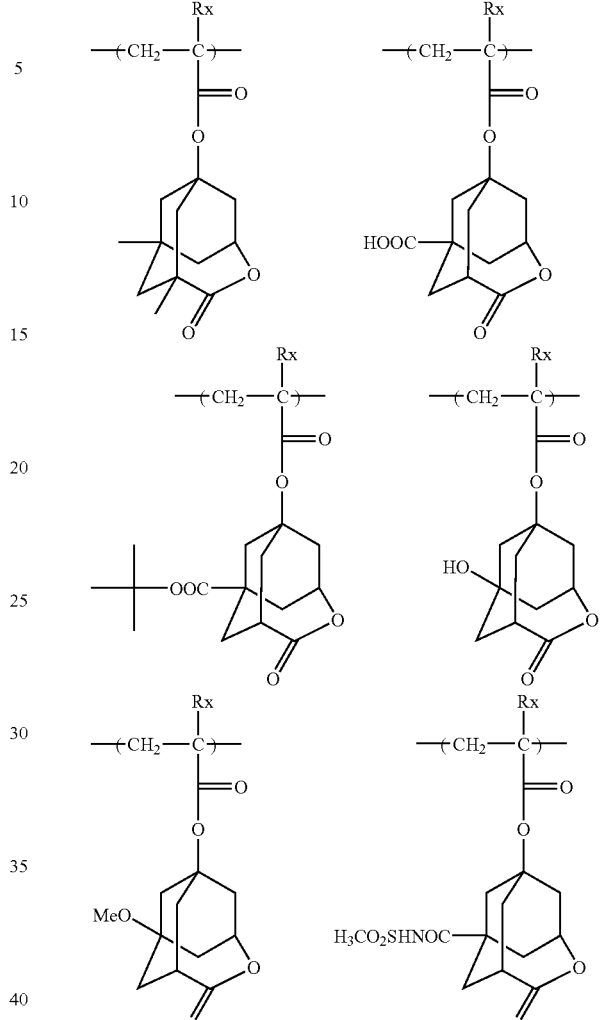

The (A) acid-decomposable resin may contain a repeating unit having a group represented by the following formula (IV):

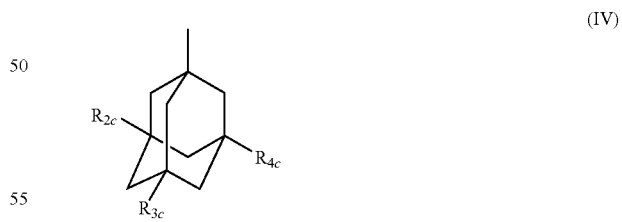

(IV)

In formula (IV), $R_{2c}$ to $R_{4c}$ each independently represents a hydrogen atom or a hydroxyl group, provided that at least one of $R_{2c}$ to $R_{4c}$ represents a hydroxyl group.

The group represented by formula (IV) is preferably a dihydroxy form or a monohydroxy form, more preferably a dihydroxy form.

Examples of the repeating unit having a group represented by formula (IV) include a repeating unit where at least one of $R_{13}'$ to $R_{16}'$ in formula (II-A) or (II-B) has a group represented by formula (IV) (for example, $R_5$ of —COOR₅ is a group represented by formula (IV)), and a repeating unit represented by the following formula (AII):

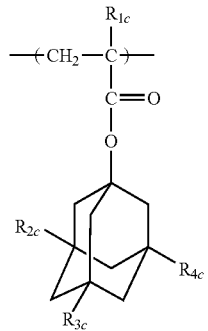
(AII)

In formula (AII), $R_{1c}$ represents a hydrogen atom or a methyl group.

$R_{2c}$ to $R_{4c}$ each independently represents a hydrogen atom or a hydroxyl group, provided that at least one of $R_{2c}$ to $R_{4c}$ represents a hydroxyl group. A repeating unit where two members out of $R_{2c}$ to $R_{4c}$ are a hydroxyl group is preferred.

Specific examples of the repeating unit having a structure represented by formula (AII) are set forth below, but the present invention is not limited thereto.

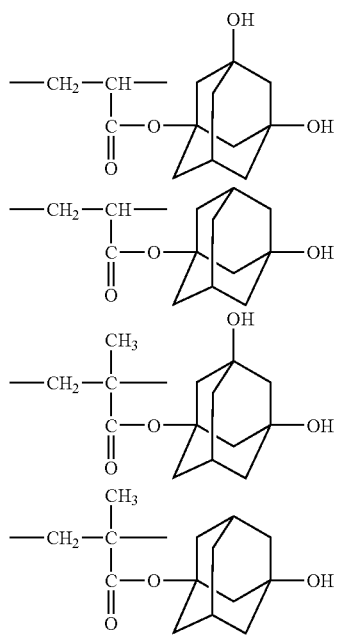

The (A) acid-decomposable resin may contain a repeating unit represented by the following formula (V):

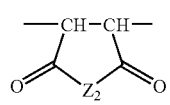
(V)

In formula (V), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group, cycloalkyl group and camphor residue of $R_{41}$ and $R_{42}$ each may be substituted by a halogen atom (preferably a fluorine atom) or the like.

Specific examples of the repeating unit represented by formula (V) are set forth below, but the present invention is not limited thereto.

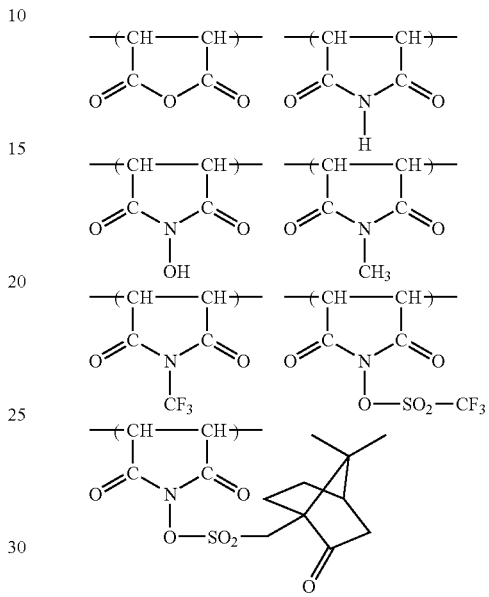

The (A) acid-decomposable resin may contain, in addition to the above-described repeating units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include repeating structural units corresponding to the monomers described below, but the present invention is not limited thereto.

By containing such a repeating structural unit, the performances required of the resin as the component (A), particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like can be subtly controlled.

Examples of the monomer include compounds having one addition polymerizable unsaturated bond, selected from acrylic acid esters, methacrylic acid esters, acrylamides, methacrylamides, allyl compounds, vinyl ethers and vinyl esters.

Other than these, an addition polymerizable unsaturated compound copolymerizable with the monomer corresponding to the above-described various repeating structural units may be copolymerized.

In the (A) acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

In the resin, the content of the repeating structural unit based on the monomer as the further copolymerization component can also be appropriately selected according to the desired resist performance, but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pVI) and the repeating unit represented by formula (II-AB).

The contents of the repeating unit containing a group having a lactone structure and the repeating unit having a group represented by formula (IV) (hydroxyadamantane structure) are as follows.

Based on the total molar number of the repeating structural unit having an alicyclic hydrocarbon-containing partial structure represented by any one of formulae (pI) to (pVI) and the repeating unit represented by formula (II-AB), the content of the repeating unit containing a group having a lactone structure is preferably from 1 to 70 mol %, more preferably from 10 to 70 mol %, and the content of the repeating unit having a group represented by formula (IV) is preferably from 1 to 70 mol %, more preferably from 1 to 50 mol %.

In the case of using the composition of the present invention for exposure with ArF, the resin preferably has no aromatic group in view of the transparency to ArF light.

The (A) acid-decomposable resin can be synthesized by an ordinary method (for example, radical polymerization).

For example, in the general synthesis method, monomer species are charged into a reaction vessel all at once or on the way of reaction and uniformly dissolved, if desired, in a reaction solvent such as tetrahydrofuran, 1,4-dioxane, ethers (e.g., diisopropyl ether), ketones (e.g., methyl ethyl ketone, methyl isobutyl ketone) and esters (e.g., ethyl acetate), or in a solvent capable of dissolving the composition of the present invention, which is described later, such as propylene glycol monomethyl ether acetate. The obtained solution is, if desired, heated in an inert gas atmosphere such as nitrogen or argon, and the polymerization is started by using a commercially available radical initiator (e.g., azo-based initiator, peroxide). If desired, the initiator is added additionally or in parts. After the completion of reaction, the reactant is charged into a solvent and the desired polymer is recovered, for example, by a powder or solid recovery method. The reaction concentration is usually 20 mass % or more, preferably 30 mass % or more, more preferably 40 mass % or more, and the reaction temperature is usually from 10 to 150° C., preferably from 30 to 120° C., more preferably from 50 to 100° C.

As for respective repeating structural units described above, one species may be used or a plurality of species may be used as a mixture. Also, in the present invention, one resin may be used or a plurality of resins may be used in combination.

The weight average molecular weight of the (A) acid-decomposable resin is preferably from 1,000 to 200,000, more preferably from 3,000 to 20,000, in terms of polystyrene by gas permeation chromatography (GPC). With a weight average molecular weight of 1,000 or more, the heat resistance and dry etching resistance can be enhanced and with a weight average molecular weight of 200,000 or less, the developability and by virtue of decrease in the viscosity, the film-forming property can be enhanced.

The molecular weight distribution (Mw/Mn, also called dispersity) is usually from 1 to 5, preferably from 1 to 4, more preferably from 1 to 3. In view of resolution, resist profile, side wall of resist pattern, roughness and the like, the molecular weight distribution is preferably 5 or less.

In the (A) acid-decomposable resin, the residual monomer amount is preferably from 0 to 10 mass %, more preferably from 0 to 5 mass %.

In the positive resist composition of the present invention, the blending amount of the (A) acid-decomposable resin is preferably from 40 to 99.99 mass %, more preferably from 50 to 99.97 mass %, based on the entire solid content of the resist.

(B) Compound Capable of Generating an Acid upon Irradiation with Actinic Rays or Radiation The compound capable of generating an acid upon irradiation with actinic rays or radiation (hereinafter sometimes referred to as an "acid generator") for use in the positive resist composition for immersion exposure of the present invention is described below.

The acid generator for use in the present invention can be selected from the compounds generally used as the acid generator.

More specifically, an acid generator may be appropriately selected from a photoinitiator for photocationic polymerization, a photoinitiator for photoradical polymerization, a photo-decoloring agent for coloring matters, a photo-discoloring agent, known compounds capable of generating an acid upon irradiation with actinic rays or radiation (e.g., far ultraviolet ray, X-ray) used for microresist and the like, and a mixture thereof.

Examples thereof include diazonium salt, phosphonium salt, sulfonium salt, iodonium salt, imidosulfonate, oxime sulfonate, diazodisulfone, disulfone and o-nitrobenzyl sulfonate.

In addition, a compound where the above-described group or compound capable of generating an acid upon irradiation with actinic rays or radiation is introduced into the polymer main or side chain, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may also be used.

Furthermore, the compounds capable of generating an acid by the effect of light described, for example, in U.S. Pat. No. 3,779,778 and European Patent 126,712 may also be used.

Among the acid generators, preferred are the compounds represented by the following formulae (ZI), (ZII) and (ZIII):

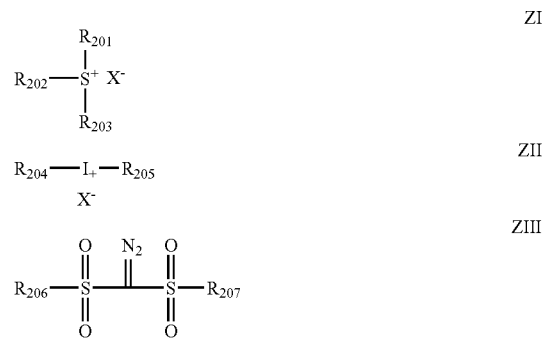

In formula (ZI), $R_{201}$, $R_{202}$ and $R_{203}$ each independently represents an organic group.

$X^-$ represents a non-nucleophilic anion.

The carbon number in the organic group of $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group of $R_{201}$, $R_{202}$ and $R_{203}$ include the corresponding groups in the compounds (Z1-1), (Z1-2) and (Z1-3) described later.

The compound may have a plurality of structures represented by formula (Z1). For example, the compound may have a structure such that at least one of $R_{201}$ to $R_{203}$ in the compound represented by formula (Z1) is bonded to at least one of $R_{201}$ to $R_{203}$ in another compound represented by formula (Z1).

The component (Z1) is more preferably a compound (Z1-1), (Z1-2) or (Z1-3) described below.

The compound (Z1-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number 1 to 15), a halogen atom, a hydroxyl group, a phenylthio group or the like. The substituent is preferably a linear or branched alkyl group having a carbon number of 1 to 12, a cycloalkyl group having a carbon number of 3 to 12 or an alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

Examples of the non-nucleophilic anion as $X^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can prevent the decomposition in aging due to intramolecular nucleophilic reaction. By virtue of this anion, the aging stability of resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

Examples of the aliphatic group in the aliphatic sulfonate anion include an alkyl group having a carbon number of 1 to 30, specifically, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group; and a cycloalkyl group having a carbon number 3 to 30, specifically, a cyclopropyl group, a cyclopentyl group, a cyclohexyl group, an adamantyl group, a norbornyl group and a boronyl group.

The aromatic group in the aromatic sulfonate anion is preferably an aryl group having a carbon number 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent.

Examples of the substituent include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7) and an alkylthio group (preferably having a carbon number of 1 to 15). As for the aryl group and ring structure in each group, examples of the substituent further include an alkyl group (preferably having a carbon number of 1 to 15).

Examples of the aliphatic group in the aliphatic carboxylate anion are the same as those of the aliphatic group in the aliphatic sulfonate anion.

Examples of the aromatic group in the aromatic carboxylate anion are the same as those of the aromatic group in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The aliphatic group, aromatic group and aralkyl group in the aliphatic carboxylate anion, aromatic carboxylate anion and aralkylcarboxylate anion each may have a substituent, and examples of the substituent include the same halogen atom, alkyl group, cycloalkyl group, alkoxy group and alkylthio group as in the aliphatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. The alkyl group may have a substituent, and examples of the substituent include a halogen atom, a halogen atom-substituted alkyl group, an alkoxy group and an alkylthio group, with a fluorine atom-substituted alkyl group being preferred.

Other examples of the non-nucleophilic anion include phosphorus fluoride, boron fluoride and antimony fluoride.

The non-nucleophilic anion of $X^-$ is preferably an aliphatic sulfonate anion with the α-position of sulfonic acid being substituted by a fluorine atom, an aromatic sulfonate anion substituted by a fluorine atom or a fluorine atom-containing group, a bis(alkylsulfonyl)imide anion with the alkyl group being substituted by a fluorine atom, or a tris(alkylsulfonyl) methide anion with the alkyl group being substituted by a fluorine atom, more preferably a perfluoro-aliphatic sulfonate anion having a carbon number of 4 to 8 or an aromatic sulfonate anion having a fluorine atom, and most preferably nonafluorobutane-sulfonate anion, perfluorooctanesulfonate anion, pentafluorobenzenesulfonate anion or 3,5-bis(trifluoromethyl)benzenesulfonate anion.

The compound (Z1-2) is described below.

The compound (Z1-2) is a compound where $R_{201}$ to $R_{203}$ in formula (ZI) each independently represents an organic group not containing an aromatic ring. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$, which may be linear or branched, is preferably a linear or branched alkyl group having a carbon number of 1 to 10, and examples thereof include a methyl group, an ethyl group, a propyl group, a butyl group and a pentyl group. The alkyl group is more preferably a linear or branched 2-oxoalkyl group or an alkoxycarbonylmethyl group.

The cycloalkyl group as $R_{201}$ to $R_{203}$ is preferably a cycloalkyl group having a carbon number 3 to 10, and examples thereof include a cyclopentyl group, a cyclohexyl group and a norbornyl group. The cycloalkyl group is more preferably a 2-oxocycloalkyl group.

The 2-oxoalkyl group, which may be linear, branched or cyclic, is preferably a group having >C=O at the 2-position of the above-described alkyl or cycloalkyl group.

The alkoxy group in the alkoxycarbonylmethyl group is preferably an alkyl group having a carbon number of 1 to 5 (e.g., methyl, ethyl, propyl, butyl, pentyl).

$R_{201}$ to $R_{203}$ may be further substituted by a halogen atom, an alkoxy group (for example, an alkoxy group having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The compound (Z1-3) is a compound represented by the following formula (Z1-3), and this is a compound having a phenacylsulfonium salt structure.

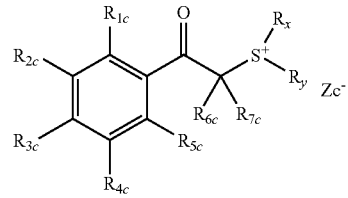

(Z1-3)

$R_{1c}$ to $R_{5c}$ each independently represents a hydrogen atom, an alkyl group, a cycloalkyl group, an alkoxy group or a halogen atom.

$R_{6c}$ and $R_{7c}$ each represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, or $R_x$ and $R_y$ may combine to form a ring structure, and the ring structure may contain an oxygen atom, a sulfur atom, an ester bond or an amide bond.

$Zc^-$ represents a non-nucleophilic anion, and examples thereof are the same as those of the non-nucleophilic anion of $X^-$ in formula (ZI).

The alkyl group as $R_{1c}$ to $R_{7c}$ is preferably a linear or branched alkyl group having a carbon number of 1 to 20, and examples thereof include a methyl group, an ethyl group, a linear or branched propyl group, a linear or branched butyl group and a linear or branched pentyl group.

The cycloalkyl group as $R_{1c}$ to $R_{7c}$ is preferably a cycloalkyl group having a carbon number of 3 to 8, and examples thereof include a cyclopentyl group and a cyclohexyl group.

The alkoxy group as $R_{1c}$ to $R_{5c}$, which may be linear, branched or cyclic, is, for example, an alkoxy group having a carbon number of 1 to 10, preferably a linear or branched alkoxy group having a carbon atom of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group, or a linear, branched or cyclic alkoxy group is preferred, and a compound where the sum of carbon atoms of $R_{1c}$ to $R_{5c}$ is from 2 to 15 is more preferred. By using such a compound, the solubility in a solvent is enhanced and the generation of particles during storage is suppressed.

Examples of the alkyl group and cycloalkyl group as $R_x$ and $R_y$ are the same as those of the alkyl group and cycloalkyl group as $R_{1c}$ to $R_{7c}$. Among these, preferred are a 2-oxoalkyl group, a 2-oxocycloalkyl group and an alkoxy-carbonylmethyl group.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group as $R_{1c}$ to $R_{5c}$.

Examples of the group formed by combining $R_x$ and $R_y$ include a butylene group and a pentylene group.

$R_x$ and $R_y$ each is preferably an alkyl group having a carbon number of 4 or more, more preferably 6 or more atoms, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group as $R_{204}$ to $R_{207}$ is preferably a linear or branched alkyl group having a carbon number 1 to 10, and examples thereof include a methyl group, an ethyl group, a propyl group, a butyl group and a pentyl group.

The cycloalkyl group as $R_{204}$ to $R_{207}$ is preferably a cycloalkyl group having a carbon number of 3 to 10, and examples thereof include a cyclopentyl group, a cyclohexyl group and a norbornyl group.

Examples of the substituent which $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Among the acid generators, the preferred compound further includes the compounds represented by the following formulae (ZIV), (ZV) and (ZVI):

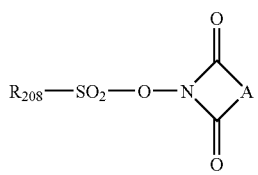

ZIV

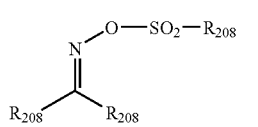

ZV

ZVI

In formula (ZIV), two $Ar_3$'s each independently represents an aryl group.

In formulae (ZV) and (ZVI), $R_{208}$ each independently represents an alkyl group, a cycloalkyl group or an aryl group, and these are the same as the alkyl group, cycloalkyl group and aryl group as $R_{204}$ to $R_{207}$ in formulae (ZI) to (ZIII).

A represents an alkylene group, an alkenylene group or an arylene group.

Among the acid generators, more preferred are the compounds represented by formulae (ZI) to (ZIII).

Particularly preferred examples of the acid generator are set forth below.

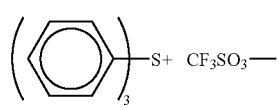

(z1)

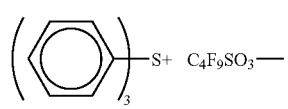

(z2)

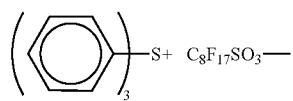

(z3)

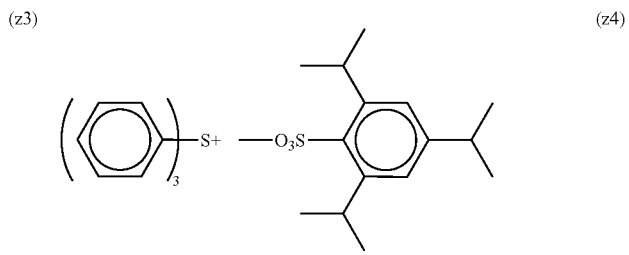

(z4)

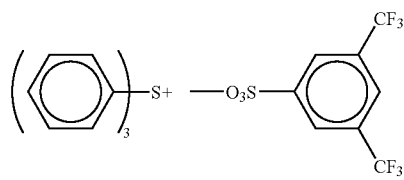

(z5)

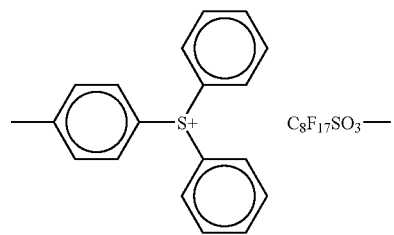

(z6)

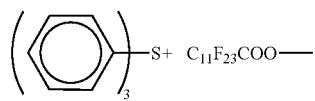

(z7)

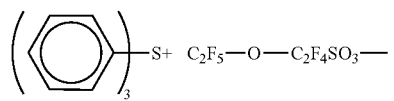

(z8)

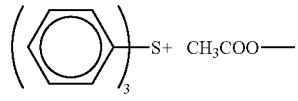

(z9)

-continued
(z10)
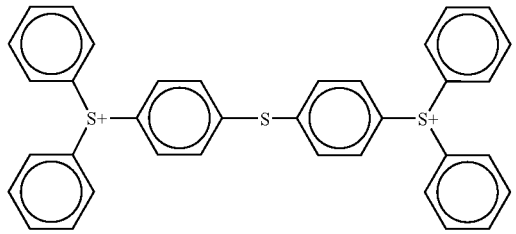 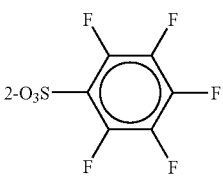
(z11) (z12)
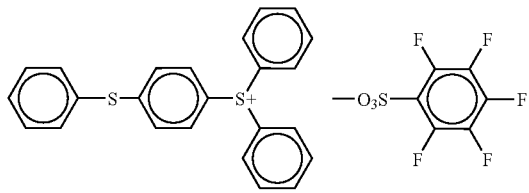 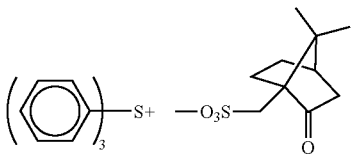
(z13)
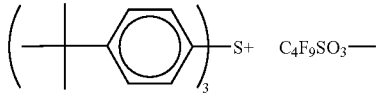
(z14)
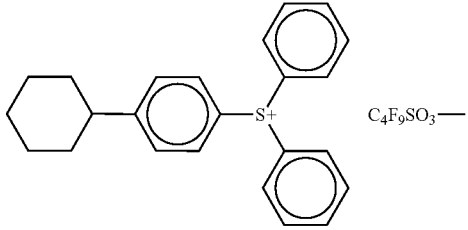
(z15) (z16)
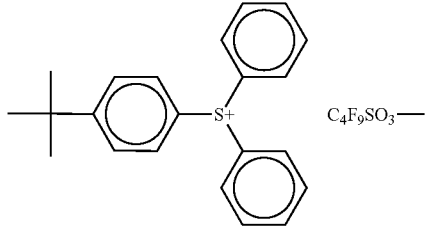 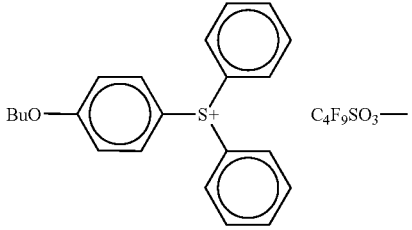
(Z17) (z18)
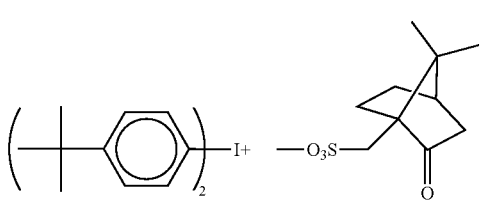 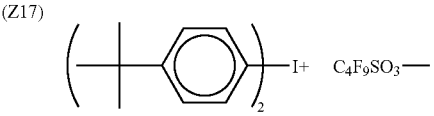
(z19) (z20)
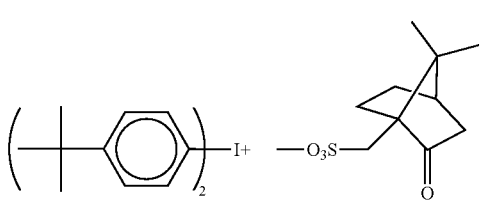 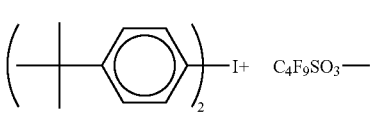
(z21) (z22)
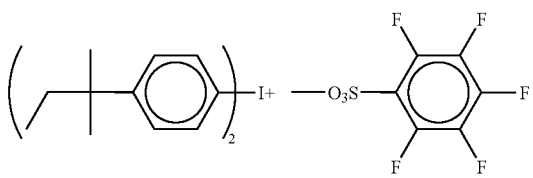 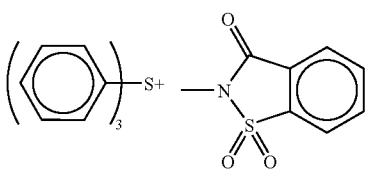

-continued
(z23) 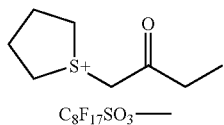
(z24) 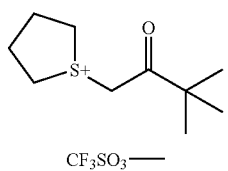
(z25) 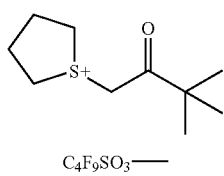
(z26) 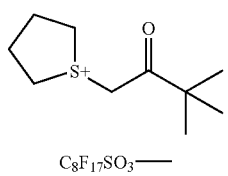
(z27) 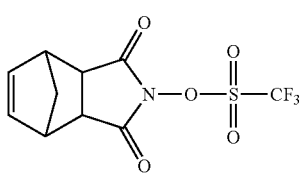
(z28) 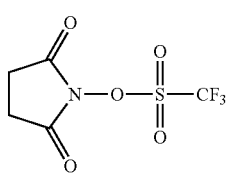
(z29) 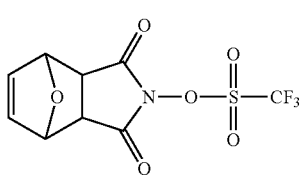
(z30) 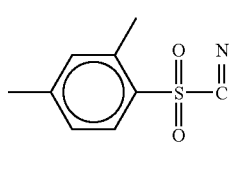
(z31) 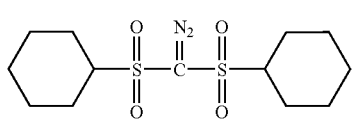
(z32) 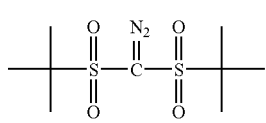
(z33) 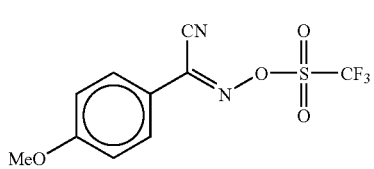
(z34) 
(z35) 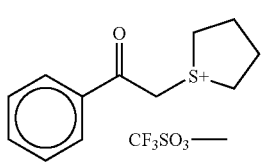
(z36) 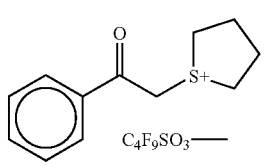
(z37) 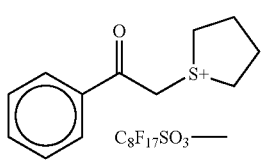
(z38) 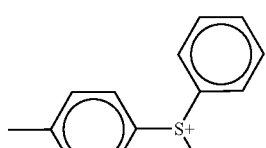

-continued
(z39) 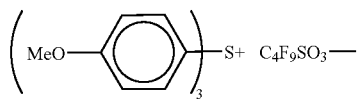
(z40) 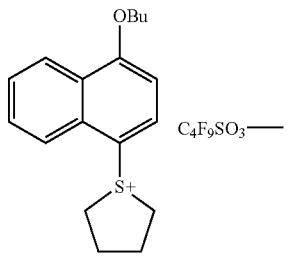
(z41) 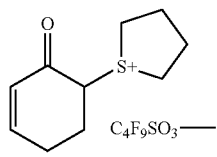
(z42) 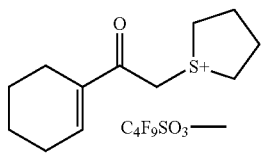
(z43) 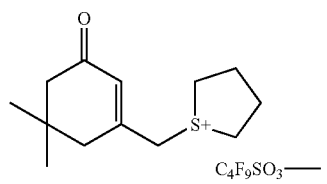
(z44) 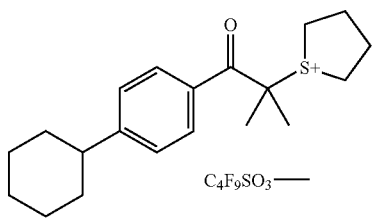
(z45) 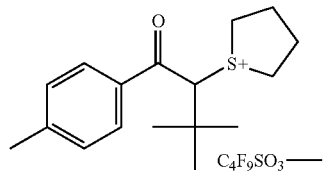
(z46) 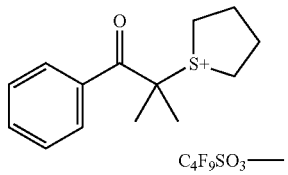
(z47) 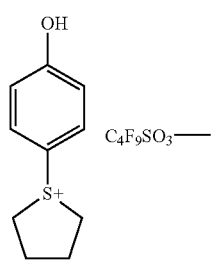
(z48) 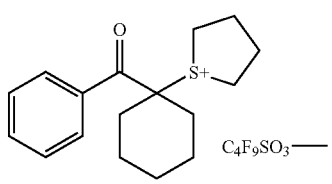
(z49) 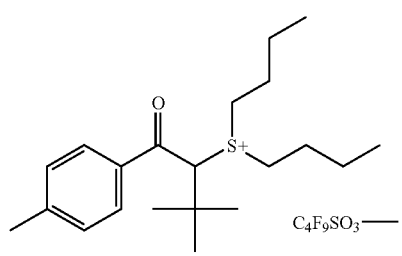
(z50) 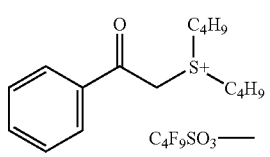
(z51) 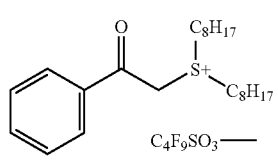
(z52) 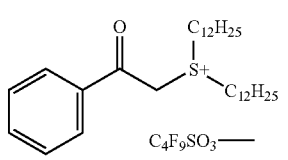

-continued

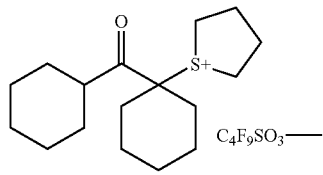 (z53)

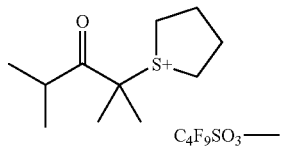 (z54)

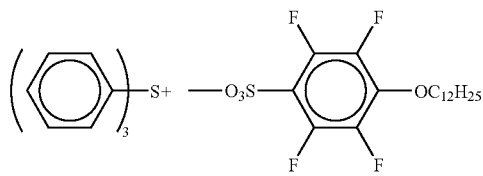 (z55)

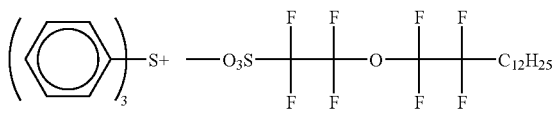 (z56)

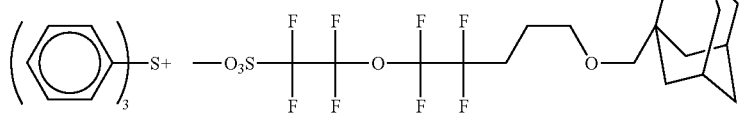 (z57)

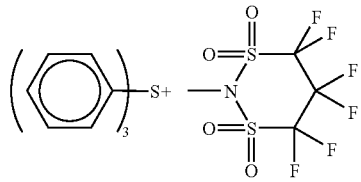 (z58)

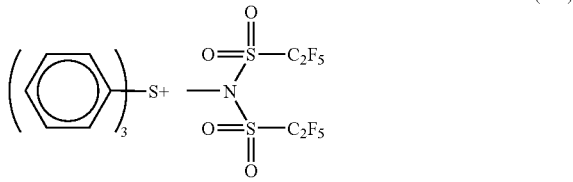 (z59)

One acid generator may be used alone or two or more kinds of acid generators may be used in combination.

The acid generator content in the positive resist composition for immersion exposure is preferably from 0.1 to 20 mass %, more preferably from 0.5 to 10 mass %, still more preferably from 1 to 7 mass %, based on the entire solid content of the resist composition.

(C) Alkali-Soluble Resin Having a Siloxane Bond as the Main Chain

The positive resist composition for immersion exposure of the present invention contains (C) an alkali-soluble resin having a siloxane bond as the main chain.

The (C) alkali-soluble resin is an alkali-soluble compound, that is, a compound soluble in an alkali developer described later (usually an alkaline aqueous solution at a pH of 10.0 to 15.0, 23° C.).

Therefore, the (C) alkali-soluble resin has an alkali-soluble group and/or a group capable of being solubilized by undergoing hydrolysis with an alkali developer.

Examples of the alkali-soluble group include a phenolic hydroxyl group, a carboxylic acid group, a fluorinated alcohol group, a sulfonic acid group, a sulfonamide group and an active methylene group-containing group. Specific examples of the active methylene group-containing group include —C(=O)—CH$_2$—C(=O)—, —C(=O)—CHR—C(=O)— (wherein R is an alkyl group), (—C(=O)—CH(C(=O))$_2$— and —SO$_2$—CH$_2$—C(=O)—).

Among those alkali-soluble group, preferred are a carboxylic acid group, a fluorinated alcohol group (preferably hexafluoroisopropanol) and a sulfonic acid group.

Examples of the group capable of being solubilized by undergoing hydrolysis with an alkali developer include a lactone group, an ester group, a sulfonamide group and an acid anhydride. Among these, preferred are a lactone group, a sulfonamide group and an acid anhydride.

The amount of the alkali-soluble group (acid group) is, in terms of the acid value of the (C) alkali-soluble resin, preferably from 2 to 10 milli-equivalents/g, more preferably from 2 to 8 milli-equivalents/g. The acid value is determined by measuring the amount (mg) of potassium hydroxide necessary for neutralizing the compound.

In the (C) alkali-soluble resin having a siloxane bond as the main chain, the siloxane bond as the main chain may be linear or ladder-type (silsequioxane).

The alkali-soluble resin has an alkali-soluble group in the side chain or at the terminal. Examples of the alkali-soluble group include a carboxylic acid, a phenolic hydroxyl group, an active methylene, a fluorine-substituted alcohol, a sulfonamide, a sulfonylamide and a sulfonic acid. Among these preferred are a carboxylic acid, a fluorine-substituted alcohol and a phenolic hydroxyl group.

In the case of having an alkali-soluble group in the side chain, the alkali-soluble group may be linked to the main chain directly or through a linking group. The linking group includes a hydrocarbon group which may have a heteroatom. In particular, a linear or cyclic carbon group is preferred. Specific examples thereof include a methylene group, an ethylene group, a propylene group, a cyclopentylene group, a cyclohexylene group, a norbornylene group and an adamantylene group.

In the (C) alkali-soluble resin having a siloxane bond as the main chain, a siloxane unit having no alkali-soluble group may be co-condensed together with the siloxane unit having an alkali-soluble group within the range of not impairing the alkali solubility of the component (C). Examples of the siloxane unit having no alkali-soluble group include a dialkylsiloxane unit, a diarylsiloxane unit and an alkylarylsiloxane unit, with the alkyl group including a linear, branched or cyclic (alicyclic) alkyl group, and the aryl group including a phenyl group. Among these, a dialkylsiloxane unit is preferred, and those having a methyl group, an ethyl group, a cyclohexyl group, a norbornyl group or an adamantyl group are more preferred.

In the (C) alkali-soluble resin having a siloxane bond as the main chain, the Si atom content (mass %) is preferably from 0.1 to 10%, more preferably from 1 to 5%.

The (C) alkali-soluble resin having a siloxane bond as the main chain preferably has a fluorine atom-containing group in the side chain of the resin.

The fluorine atom in the side chain of the resin is preferably present as a substituent on the carbon atom to which a hydroxyl group is bonded, or as a substituent on a carbon atom adjacent to the carbon atom to which a hydroxyl group is bonded. The fluorine atom-containing group is, for example, preferably a group having a structure of the following formula (α) or (β):

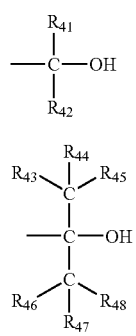

In formulae (α) and (β), $R_{41}$ and $R_{42}$ each independently represents an arbitrary substituent, provided that any one of these substituents is a fluorine atom.

$R_{43}$ to $R_{48}$ each independently represents a substituent, provided that at least one of these substituents is a fluorine atom. Three or more members out of $R_{43}$ to $R_{48}$ are preferably a fluorine atom, and it is most preferred that all of $R_{43}$ to $R_{48}$ are a fluorine atom.

The weight average molecular weight of the alkali-soluble resin is preferably from 3,000 to 200,000, more preferably from 5,000 to 200,000, still more preferably from 5,000 to 100,000.

In the alkali-soluble resin, the residual monomer amount is preferably from 0 to 10 mass %, more preferably from 0 to 5 mass %. The molecular weight distribution (Mw/Mn, also called dispersity) is usually from 1 to 5, preferably from 1 to 4, more preferably from 1 to 3. In view of resolution, resist profile, side wall of resist pattern, roughness and the like, the molecular weight distribution is preferably 5 or less.

In the positive resist composition for immersion exposure, the amount added of the (C) alkali-soluble resin is preferably from 0.1 to 10 mass %, more preferably from 0.2 to 5 mass %, still more preferably from 0.5 to 2 mass %, based on the entire solid content of the resist composition.

In the case where the positive resist composition for immersion exposure is a resist composition for exposure with ArF, the alkali-soluble resin preferably contains no aromatic ring.

One alkali-soluble resin may be used alone, or a plurality of alkali-soluble resins may be used as a mixture.

The alkali-soluble resin of the present invention can be synthesized by condensation polymerizing an alkoxysilane or halosialne compound having an alkali-soluble group under heating in a hydrous solvent by an acid catalyst or an alkali catalyst.

Specific examples of the alkali-soluble resin are set forth below, but the present invention is not limited thereto.

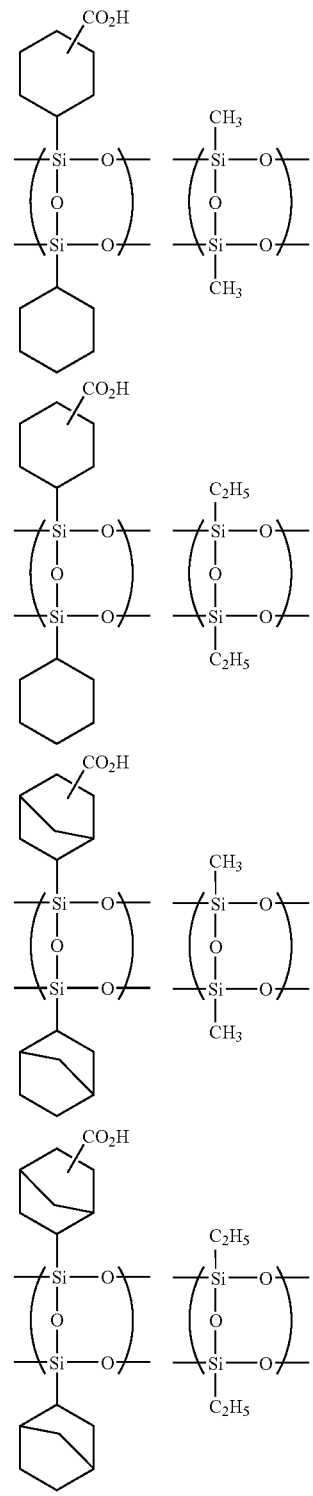

-continued
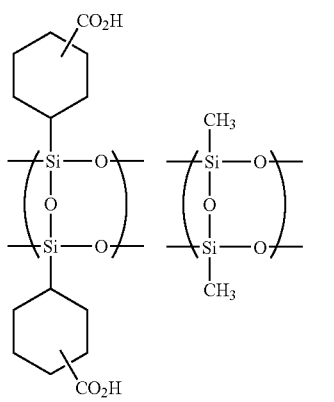
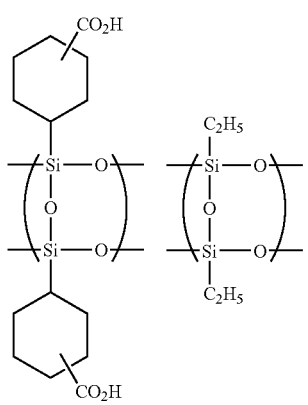
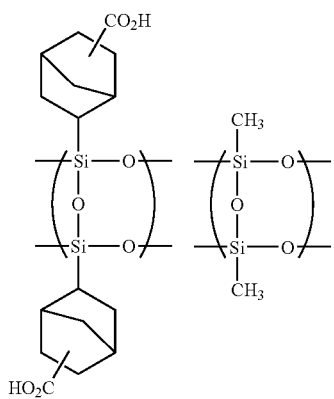
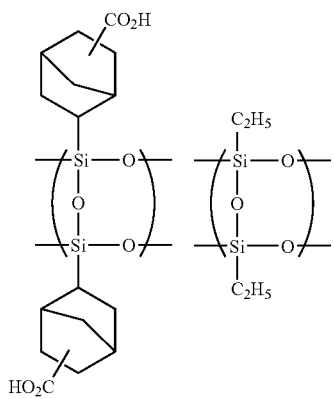
-continued
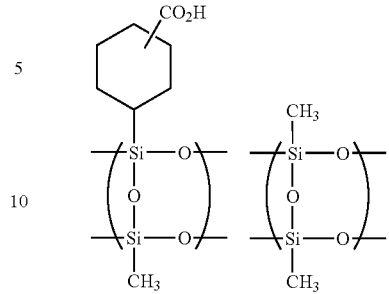
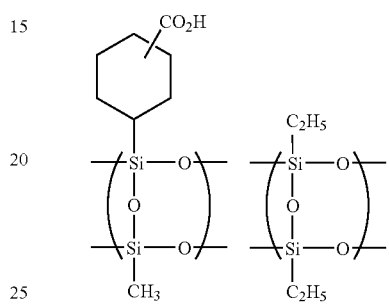
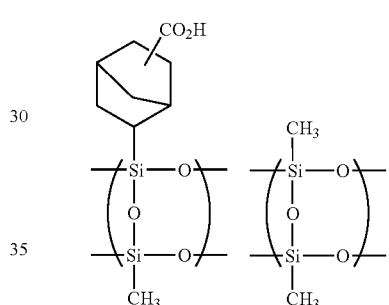
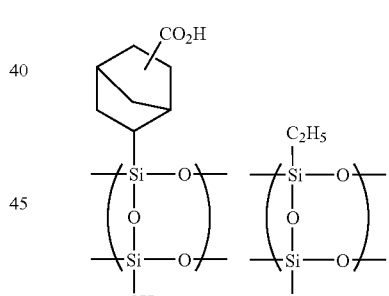
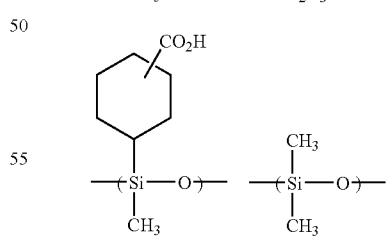
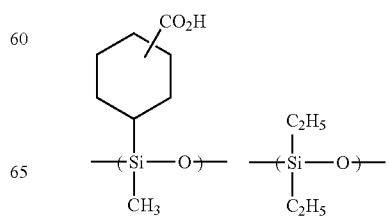

-continued
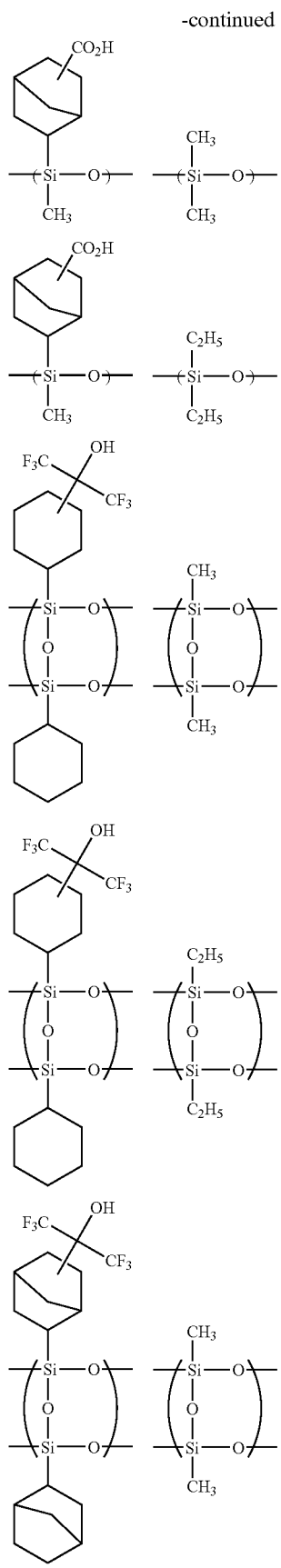
-continued
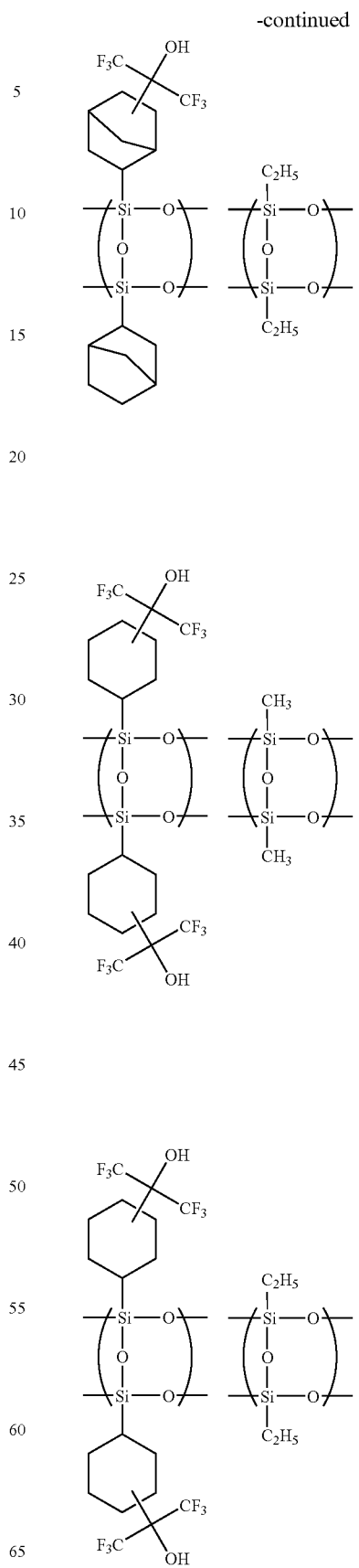

-continued
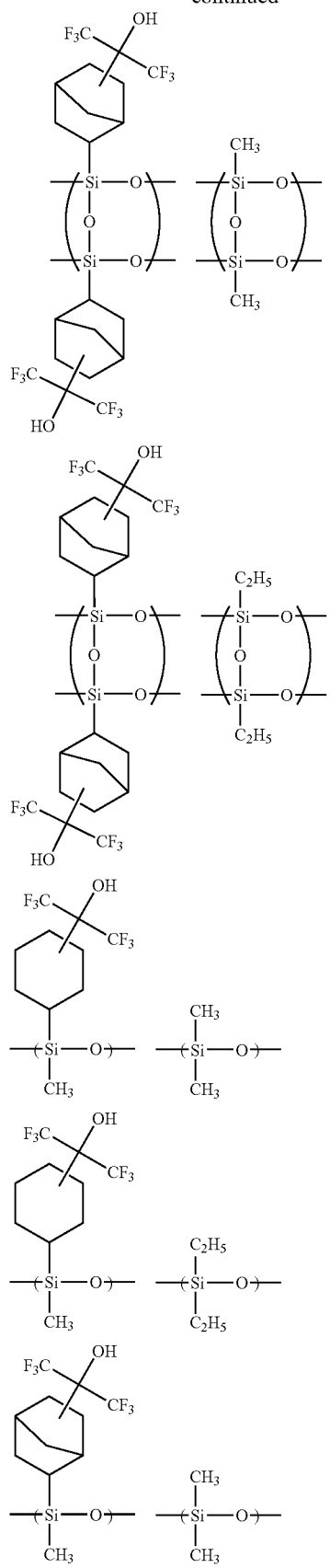
-continued
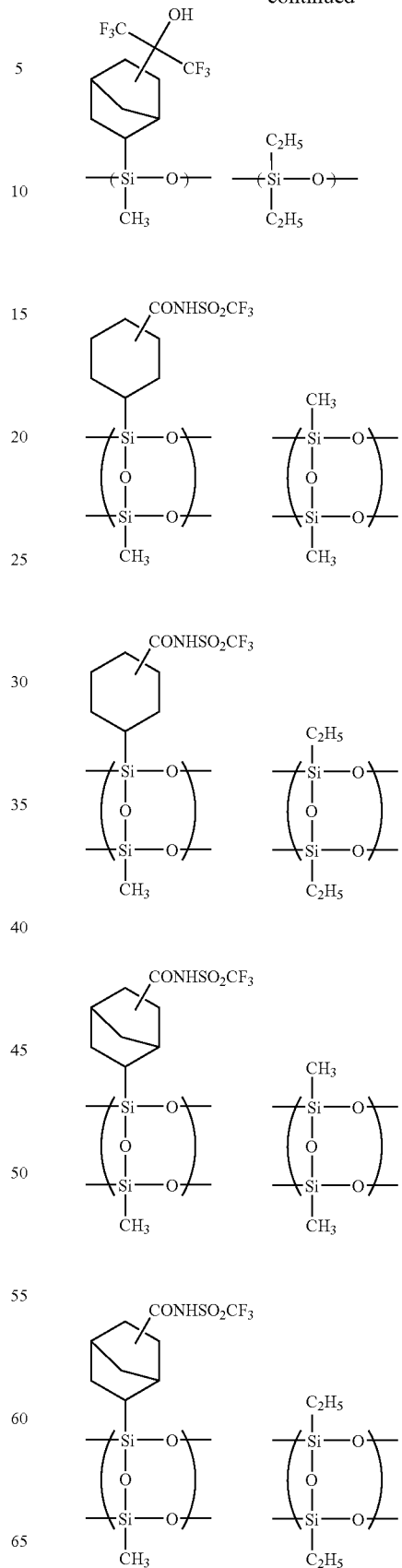

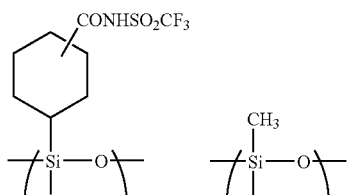
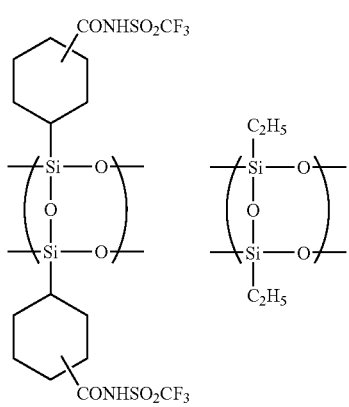
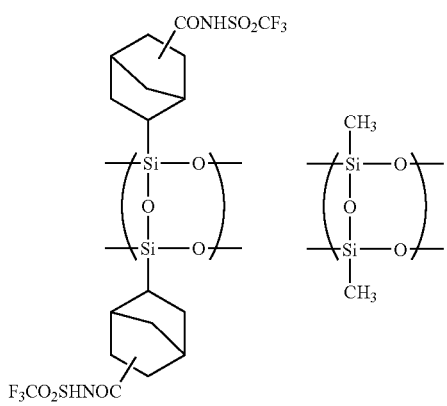
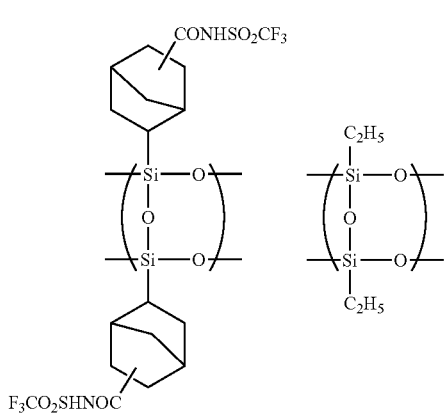
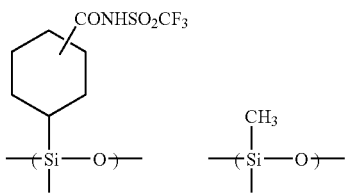
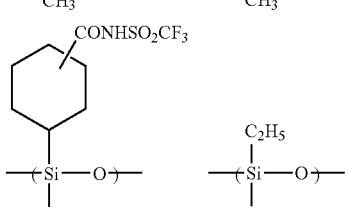
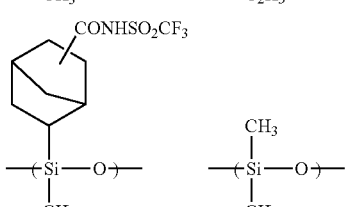
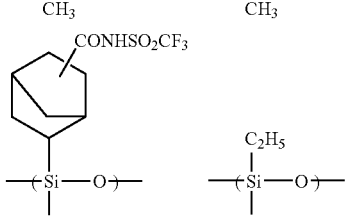
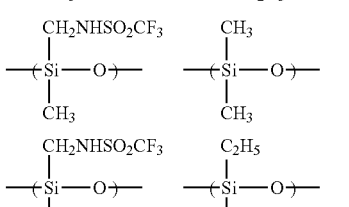
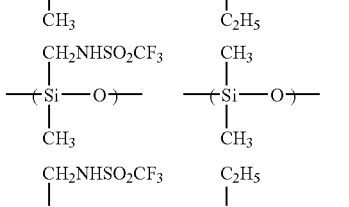
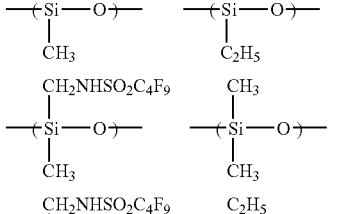
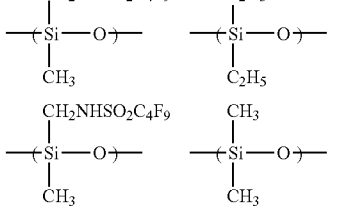

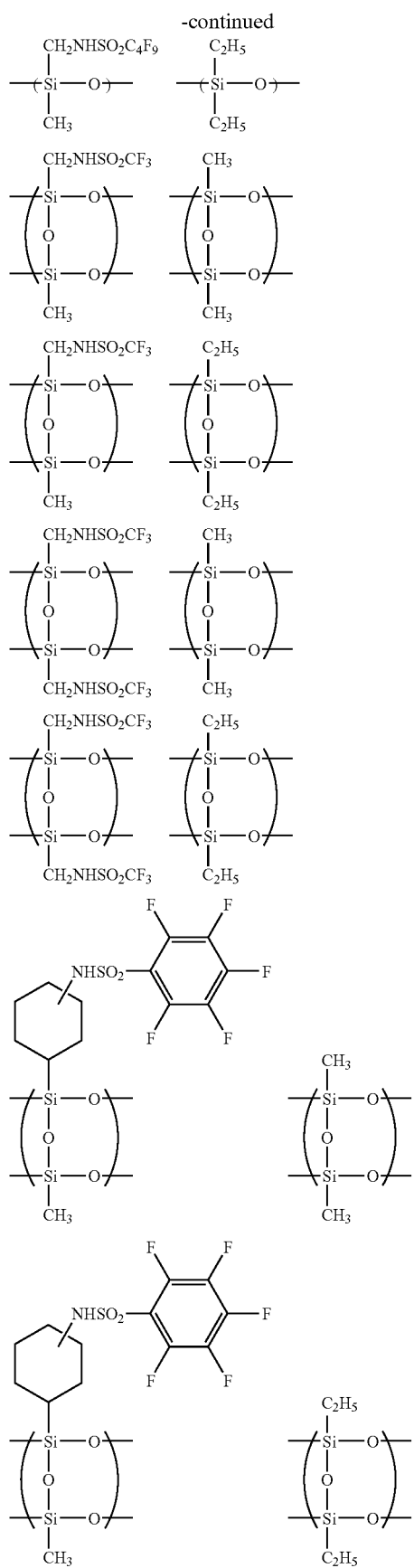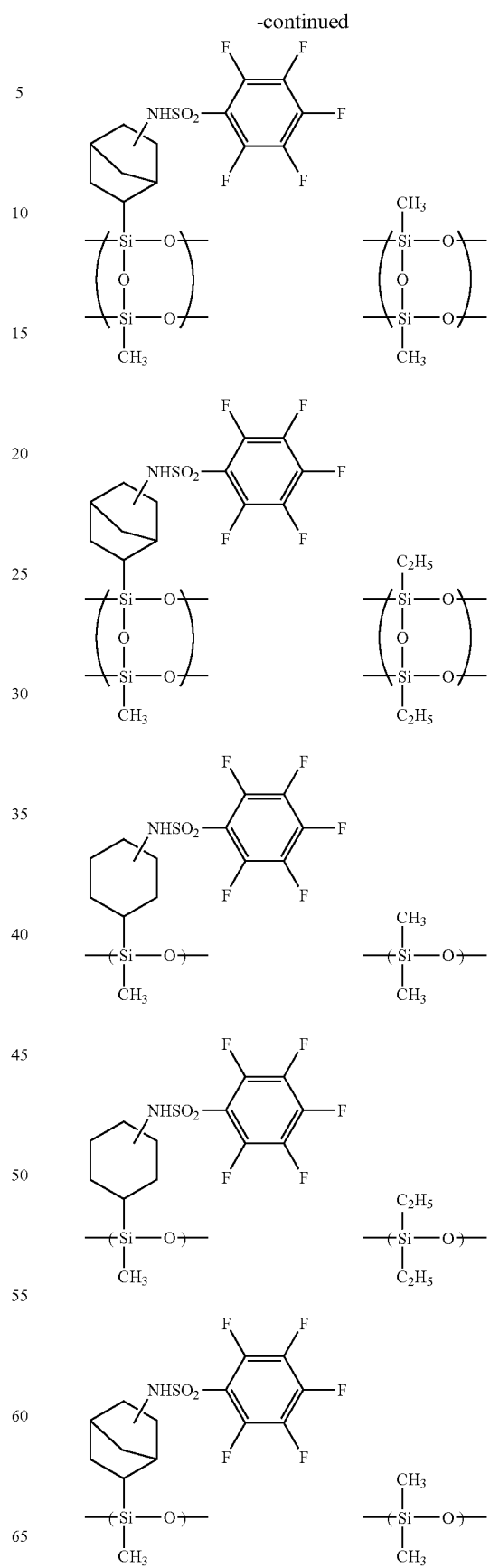

-continued

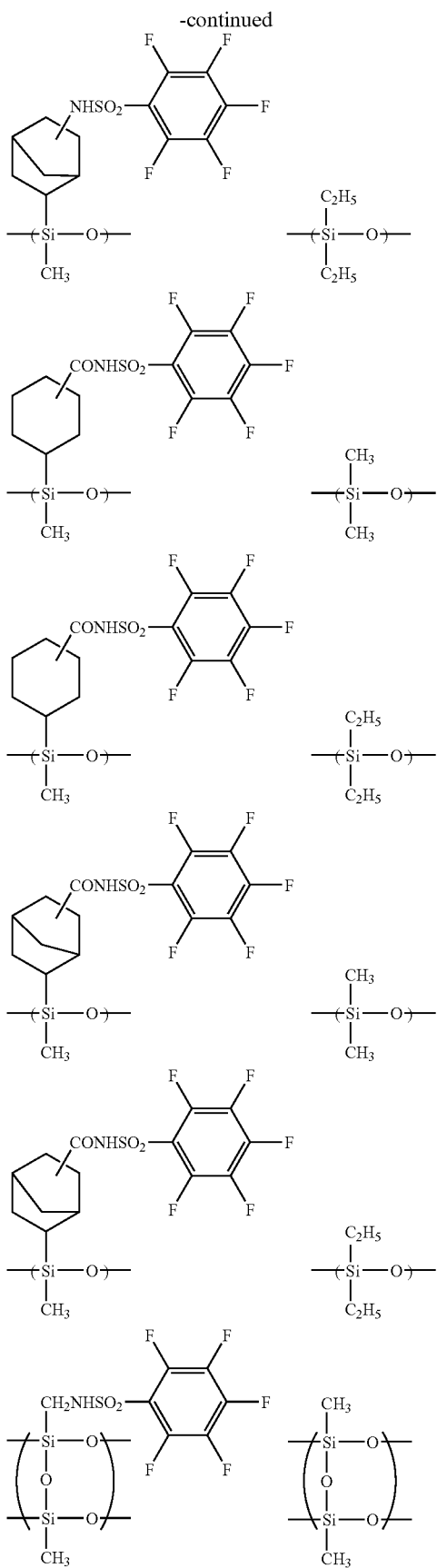

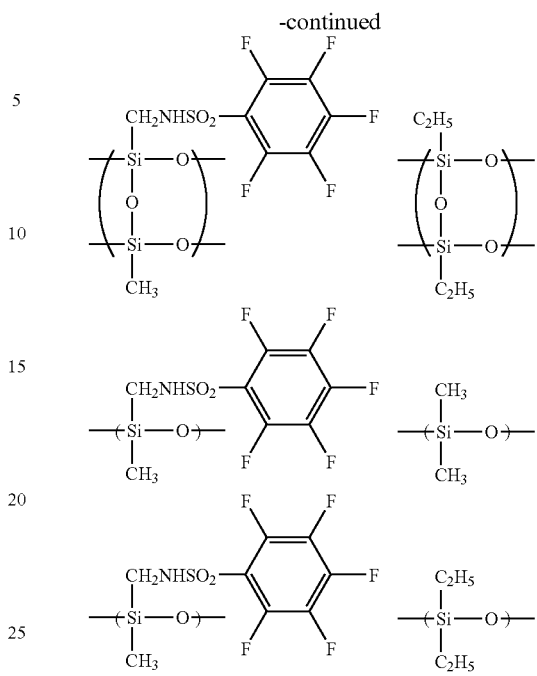

(D) Organic Solvent

The positive resist composition for immersion exposure of the present invention is used by dissolving the above-described components in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, methoxybutanol and tetrahydrofuran.

In the present invention, a mixed solvent prepared by mixing a solvent having a hydroxyl group in the structure and a hydroxyl group-free solvent may be used as the organic solvent.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the hydroxy group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethyl sulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are more preferred.

The mixing ratio (by mass) between the hydroxy group-containing solvent and the hydroxy group-free solvent is preferably from 1/99 to 99/1, more preferably from 10/90 to 90/10, still more preferably from 20/80 to 60/40. A mixed solvent containing the hydroxy group-free solvent in a proportion of 50 mass % or more is particularly preferred in view of coating uniformity.

By using such a solvent, a resist composition having a concentration of, in terms of the solid content concentration, usually from 3 to 25 mass %, preferably from 5 to 22 mass %, more preferably from 7 to 20 mass %, still more preferably from 5 to 15 mass %, is prepared.

(E) Organic Basic Compound

The composition of the present invention may contain an organic basic compound for the purpose of preventing fluctuation of the performance (e.g., T-top profile formation of pattern, fluctuation of sensitivity, fluctuation of pattern line width) in aging from irradiation with actinic rays or radiation to the heating treatment, fluctuation of the performance in aging after coating, or excessive diffusion of an acid (deterioration of resolution) during heat treatment after the irradiation with active rays or radiation. The organic basic compound is, for example, an organic basic compound containing a basic nitrogen, and a compound having a conjugate acid pKa value of 4 or more is preferably used.

Specific examples of the structure therefor include structures represented by the following formulae (A) to (E).

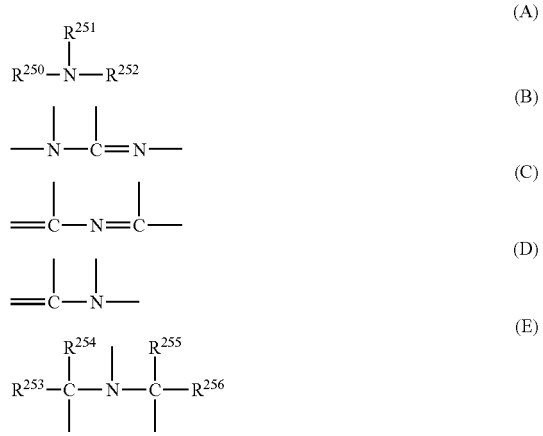

In these formulae, $R^{250}$, $R^{251}$ and $R^{252}$, which may be the same or different, each independently represents a hydrogen atom, an alkyl group having a carbon number of 1 to 20, a cycloalkyl group having a carbon number of 1 to 20, or an aryl group having a carbon number of 6 to 20, and $R^{251}$ and $R^{252}$ may combine with each other to form a ring. Examples of the substituent which these groups each may have include an amino group and a hydroxyl group.

$R^{253}$, $R^{254}$, $R^{255}$ and $R^{256}$, which may be the same or different, each represents an alkyl group having a carbon number of 1 to 6.

Specific preferred examples of the compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A basic ammonium salt may also be used. Specific examples of the basic ammonium salt include, but are not limited to, the following compounds.

Specific examples thereof include ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxylate, ammonium tridecylcarboxylate, ammonium tetradecylcarboxylate, ammonium pentadecylcarboxylate, ammonium hexadecylcarboxylate, ammonium heptadecylcarboxylate and ammonium octadecylcarboxylate.

Specific examples of the ammonium hydroxide include tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethylammonium hydroxide, tetrakisdecylammonium hydroxide, dodecyltrimethylammonium hydroxide, dodecylethyldimethylammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)-trimethylammonium hydroxide, (2-bromoethyl)trimethylammonium hydroxide, (3-bromopropyl)-trimethylammonium hydroxide, (3-bromopropyl)triethylammonium hydroxide, glycidyl trimethylammonium hydroxide, choline hydroxide, (R)-(+)-(3-chloro-2-hydroxypropyl)trimethylammonium hydroxide, (S)-(−)-(3-chloro-2-hydroxypropyl)trimethylammonium hydroxide, (3-chloro-2-hydroxypropyl)trimethylammonium hydroxide, (2-aminoethyl)-trimethylammonium hydroxide, hexamethonium hydroxide, decamethonium hydroxide, 1-azoniapropellane hydroxide, petronium hydroxide, 2-chloro-1,3-dimethyl-2-imidazolinium hydroxide and 3-ethyl-2-methyl-2-thiazolinium hydroxide.

One or more species of these organic basic compounds may be used, and it is preferred to use two or more species thereof.

The amount of the organic basic compound used is usually from 0.001 to 10 mass %, preferably from 0.01 to 5 mass %, based on the solid content of the positive resist composition for immersion exposure.

The ratio of the acid generator and the organic basic compound used in the composition is preferably acid generator/organic basic compound (by mol)=from 2.5 to 300. That is, in view of sensitivity and resolution, the molar ratio is preferably 2.5 or more, and in the light of suppressing reduction in the resolution due to thickening of the resist pattern in agent after exposure to heat treatment, the molar ratio is preferably 300 or less. The acid generator/organic basic compound (by mol) is more preferably from 5.0 to 200, still more preferably from 7.0 to 150.

(F) Dissolution Inhibiting Compound Capable of Decomposing under the Action of an Acid to Increase the Solubility in an Alkali Developer The positive resist composition for immersion exposure of the present invention may contain a dissolution inhibiting compound capable of decomposing under the action of an acid to increase the solubility in an alkali developer (hereinafter, sometimes referred to as a "dissolution inhibiting compound").

In order to prevent reduction in the transparency to light at 220 nm or less, the dissolution inhibiting compound is preferably an alicyclic or aliphatic compound containing an acid-decomposable group, such as acid-decomposable group-containing cholic acid derivatives described in *Proceeding of SPIE*, 2724, 355 (1996). Examples of the acid-decomposable group and the alicyclic structure are the same as those described above for the (A) acid-decomposable resin.

The molecular weight of the dissolution inhibiting compound is preferably 3,000 or less, more preferably from 300 to 3,000, still more preferably from 500 to 2,500.

The amount of the dissolution inhibiting compound added is preferably from 1 to 30 mass %, more preferably from 2 to 20 mass %, based on the entire solid content of the positive resist composition for immersion exposure.

Specific examples of the dissolution inhibiting compound are set forth below, but the present invention is not limited thereto.

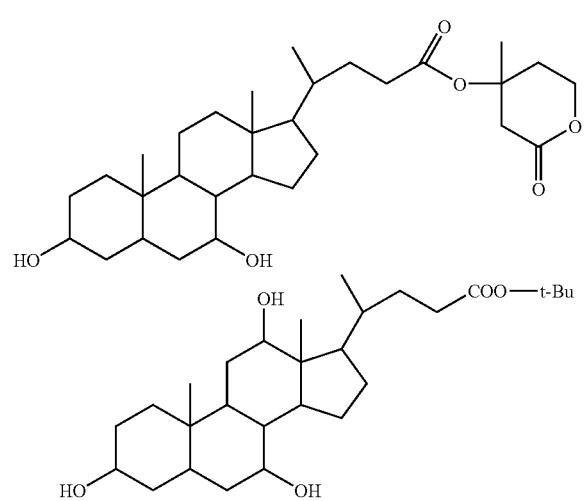

-continued

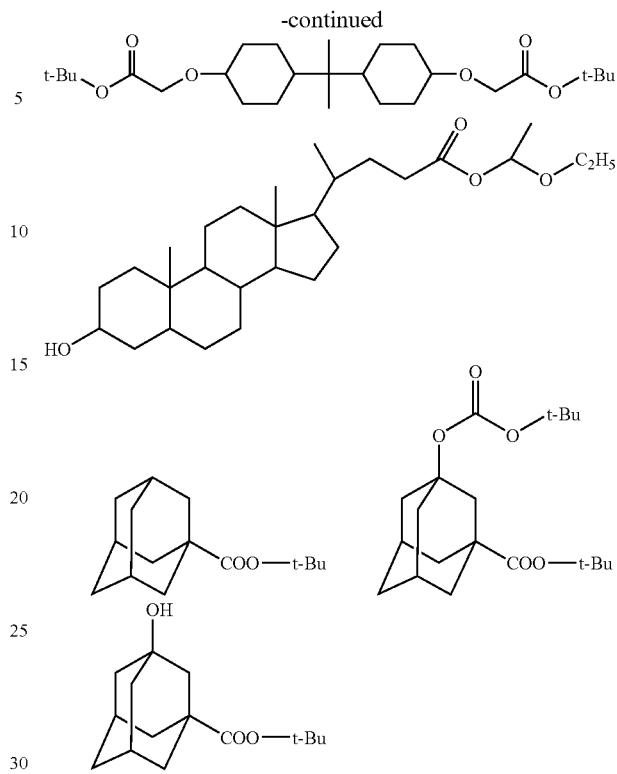

(G) Surfactant

The positive resist composition for immersion exposure of the present invention may further contain (G) a surfactant. As for the surfactant, it is preferred to contain any one fluorine- and/or silicon-containing surfactant (a fluorine-containing surfactant, a silicon-containing surfactant or a surfactant containing both a fluorine atom and a silicon atom), or two or more species thereof.

When the positive resist composition for immersion exposure of the present invention contains (G) a surfactant, this provides an improvement effect on the sensitivity, resolution, adhesion, suppression of development defect, and the like, at the exposure using a light source of 250 nm or less, particularly 220 nm or less.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound produced by a telomerization process (also called a telomer process) or an oligomerization process (also called an oligomer process) may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer with a (poly(oxyalkylene)) acrylate (or methacrylate) may be not only a binary copolymer but also a ternary or greater copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.). Other examples include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some members thereof may be used in combination.

The amount of the (G) surfactant used is preferably from 0.0001 to 2 mass %, more preferably from 0.001 to 1 mass %, based on the entire amount of the positive resist composition for immersion exposure (excluding the solvent).

(H) Alkali-Soluble Resin

The positive resist composition for immersion exposure of the present invention may further contain a resin soluble in an alkali developer. By virtue of this resin, the sensitivity is enhanced.

In the present invention, as this resin, a novolak resin having a molecular weight of approximately from 1,000 to 20,000, or a polyhydroxystyrene derivative having a molecular weight of approximately from 3,000 to 50,000 may be used, but such a resin have large absorption for light of 250 nm or less and therefore, is preferably used after partial hydrogenation or in an amount of 30 mass % or less of the entire resin amount.

Also, a resin containing a carboxyl group as the alkali-soluble group may be used. The carboxyl group-containing resin preferably has a monocyclic or polycyclic alicyclic hydrocarbon group so as to enhance the dry etching resistance. Specific examples thereof include a copolymer of a (meth)acrylic acid with a methacrylic acid ester having an alicyclic hydrocarbon structure not exhibiting acid decomposability, and a (meth)acrylic acid ester resin of an alicyclic hydrocarbon group having a carboxyl group at the terminal.

The amount of such an alkali-soluble resin added is usually 30 mass % or less based on the total amount of the resins including the (A) acid-decomposable resin.

(I) Onium Carboxylate

The positive resist composition for immersion exposure of the present invention may contain an onium carboxylate.

Examples of the onium carboxylate for use in the present invention include sulfonium carboxylate, iodonium carboxylate and ammonium carboxylate. In particular, the onium carboxylate is preferably an iodonium salt or a sulfonium salt. Also, in the onium carboxylate for use in the present invention, the carboxylate residue preferably contains neither an aromatic group nor a carbon-carbon double bond. The anion moiety is preferably a linear, branched, monocyclic or polycyclic alkyl carboxylate anion having a carbon number of 1 to 30, more preferably a carboxylate anion where the alkyl group is partially or entirely substituted by fluorine. The alkyl chain may contain an oxygen atom. By virtue of such a salt, the transparency to light of 220 nm or less is ensured, the sensitivity and resolving power are enhanced, and the defocus latitude depended on line pitch and the exposure margin are improved.

Examples of the fluorine-substituted carboxylate anion include fluoroacetate anion, difluoroacetate anion, trifluoroacetate anion, pentafluoropropionate anion, heptafluorobutyrate anion, nonafluoropentanoate anion, perfluorododecanoate anion, perfluorotridecanoate anion, perfluorocyclohexanecarboxylate anion and 2,2-bistrifluoromethylpropionate anion.

These onium carboxylates can be synthesized by reacting a sulfonium, iodonium or ammonium hydroxide and a carboxylic acid with silver oxide in an appropriate solvent.

The onium carboxylate content in the composition is suitably from 0.1 to 20 mass %, preferably from 0.5 to 10 mass %, more preferably from 1 to 7 mass %, based on the entire solid content of the positive resist composition for immersion exposure.

(J) Other Additives

If desired, the positive resist composition for immersion exposure of the present invention may further contain, for example, a dye, a plasticizer, a photosensitizer and a compound (for example, a phenol compound having a molecular weight of 1,000 or less, or an alicyclic or aliphatic compound having a carboxyl group) which accelerates the dissolution in a developer.

The phenol compound having a molecular weight of 1,000 or less can be easily synthesized by one skilled in the art according to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

Incidentally, the metal content in the positive resist composition for immersion exposure of the present invention is preferably 100 ppb or less.

(K) Pattern Forming Method

The positive resist composition for immersion exposure of the present invention is used by dissolving the above-described components in a predetermined organic solvent, preferably a mixed solvent described above, and coating the obtained solution on a predetermined support as follows.

That is, the positive resist composition for immersion exposure is coated on a substrate (e.g., silicon/silicon dioxide-coated substrate) as those used in the production of precision integrated circuit devices, to an arbitrary thickness (usually from 50 to 500 nm) by an appropriate coating method such as spinner or coater.

After the coating, the resist coated is dried by spinning or baking to form a resist film and then exposed through a mask or the like for pattern formation with intervention of an immersion liquid (immersion exposure). The exposure amount may be appropriately selected but is usually from 1 to 100 mJ/cm$^2$. After the exposure, the resist film is preferably subjected to spinning and/or baking and then subjected to development and rinsing, whereby a pattern is obtained. Baking is preferably performed after the exposure, and the baking temperature is usually from 30 to 300° C. In view of the PED described above, the time from exposure to the baking step is preferably shorter.

The exposure light used here is preferably a far ultraviolet ray at a wavelength of 250 nm or less, more preferably 220 nm or less. Specific examples thereof include KrF excimer laser (248 nm), ArF excimer laser (193 nm), F$_2$ excimer laser (157 nm) and X-ray.

The immersion liquid for use in the immersion exposure is described below.

The immersion liquid is preferably a liquid transparent to light at the exposure wavelength and having a small temperature coefficient of refractive index as much as possible so as to minimize the distortion of an optical image projected on the resist. Particularly, when the exposure light source is an ArF excimer laser (wavelength: 193 nm), water is preferably used in view of easy availability and easy handleability, in addition to the above-described aspects.

In the case of using water as the immersion liquid, for the purpose of decreasing the surface tension of water and increasing the surface activity, an additive (liquid) which does not dissolve the resist layer on a wafer and at the same time, gives only a negligible effect on the optical coat on the lower surface of a lens element may be added at a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and the content concentration thereof is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist.

Therefore, the water used is preferably distilled water. Furthermore, pure water after filtration through an ion exchange filter or the like may also be used.

The electrical resistance of water is preferably 18.3 M-ohm·cm or more, and TOC (organic material concentration) is preferably 20 ppb or less. Also, the water is preferably subjected to a deaeration treatment.

In order to prevent the resist film from directly contacting with the immersion liquid, an immersion liquid sparingly soluble film (hereinafter, sometimes referred to as a "topcoat") may be provided between the immersion liquid and the resist film formed of the positive resist composition for immersion exposure of the present invention. The functions required of the topcoat are suitability for coating on the resist upper layer part, transparency to radiation particularly at 193 nm, and low solubility in the immersion liquid. It is preferred that the topcoat does not intermix with the resist and can be uniformly coated on the resist upper layer.

In view of transparency to light at 193 nm, the topcoat preferably comprises an aromatic-free polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer.

On peeling off the topcoat, a developer may be used or a releasing agent may be separately used. The releasing agent is preferably a solvent less permeating into the resist. From the standpoint that the peeling step can be performed simultaneously with the resist development step, the topcoat is preferably peelable with an alkali developer and in view of peeling with an alkali developer, the topcoat is preferably acidic, but in view of non-intermixing with the resist, the topcoat may be neutral or alkaline.

With no difference in the refractive index between the topcoat and the immersion liquid, the resolving power is enhanced. When the exposure light source is an ArF excimer laser (wavelength: 193 nm), water is preferred as the immersion liquid and therefore, the topcoat for ArF immersion exposure preferably has a refractive index close to the refractive index (1.44) of water. Also, in view of transparency and refractive index, the topcoat is preferably a thin film.

The alkali developer for use in the development step may be, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In this alkaline aqueous solution, alcohols and a surfactant may also be added each in an appropriate amount.

As for the rinsing solution, pure water is used and this may be used after adding an appropriate amount of a surfactant thereto.

The alkali concentration of the alkali developer is usually from 0.1 to 20 mass %.

The pH of the alkali developer is usually from 10.0 to 15.0.

After the development or rinsing, a treatment of removing the developer or rinsing solution adhering on the pattern by a supercritical fluid may be performed.

EXAMPLES

The present invention is described in greater detail below by referring to Examples, but the present invention is not limited thereto.

Synthesis of Resin (1):

2-Adamantyl-2-propyl methacrylate, 3,5-dihydroxy-1-adamantyl methacrylate and norbornane lactone methacrylate were charged at a ratio of 40/20/40 (by mol) and dissolved in propylene glycol monomethyl ether acetate/propylene glycol monomethyl ether (=60/40 (by mass)) to prepare 450 g of a solution having a solid content concentration of 22 mass %. Subsequently, 1 mol % of a polymerization initiator, V-601 (dimethyl 2,2'-azobis(2-methylpropionate)), produced by Wako Pure Chemical Industries, Ltd. was added to this solution, and the resulting solution was added dropwise to 50 g of a mixed solution of propylene glycol monomethyl ether acetate/propylene glycol monomethyl ether (=60/40 (by mass)) heated at 100° C. over 6 hours, in a nitrogen atmosphere. After the completion of dropwise addition, the reaction solution was stirred for 2 hours, and when the reaction was completed, the reaction solution was cooled to room temperature and then crystallized in 5 L of a mixed solvent of hexane/ethyl acetate (=9/1 (by mass)), and the precipitated white powder was collected by filtration, thereby recovering the objective Resin (1). The polymer compositional ratio (2-adamantyl-2-propyl methacrylate/3,5-dihydroxy-1-adamantyl methacrylate/ norbornane lactone acrylate: a/b/c) determined from $^{13}$CNMR and measurement of polymer acid value was 39/21/40 (by mol). The weight average molecular weight (Mw) in terms of standard polystyrene determined by the GPC measurement was 9,700, and the dispersity (Mw/Mn) was 2.01.

Resins (2) to (20) used in Examples were synthesized in the same manner as Resin (1). The structures of Resins (1) to (20) are shown below.

(1)

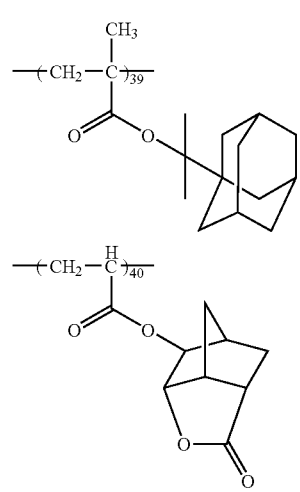

(continued)

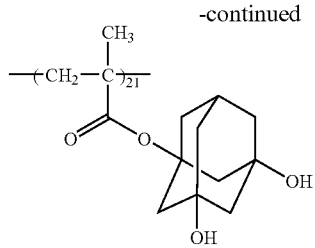

Mw = 9700
Mw/Mn = 2.01

(2)

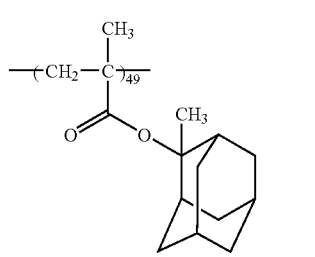

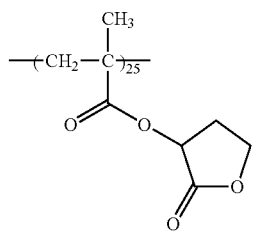

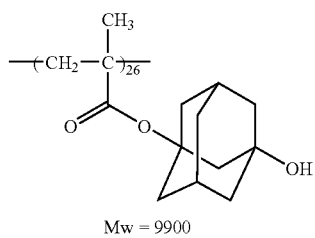

Mw = 9900
Mw/Mn = 1.99

(3)

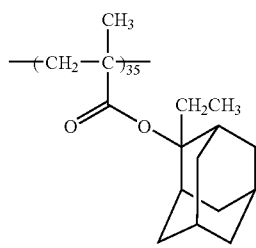

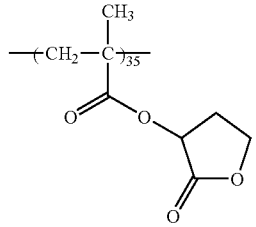

-continued
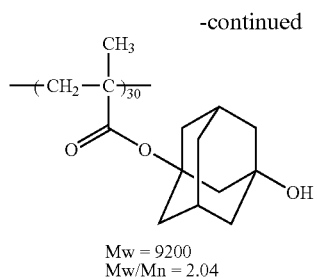
Mw = 9200
Mw/Mn = 2.04
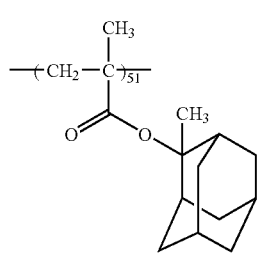
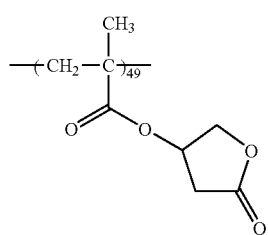
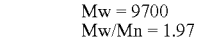
Mw = 9700
Mw/Mn = 1.97
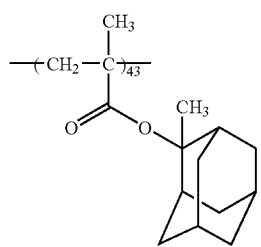
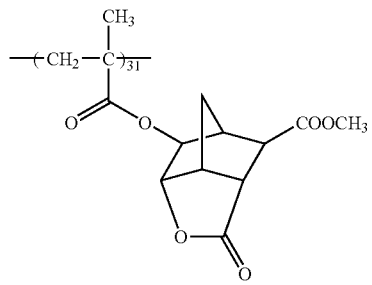
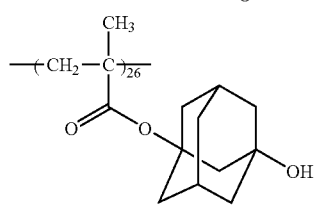
Mw = 8200
Mw/Mn = 1.91
-continued
(6)
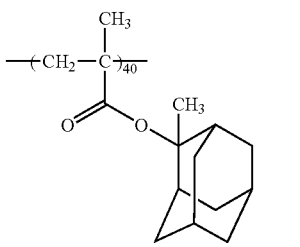
(4)
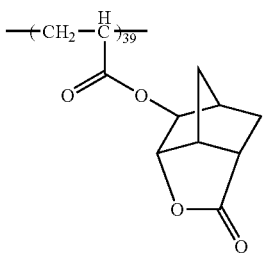
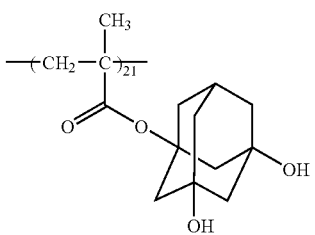
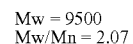
Mw = 9500
Mw/Mn = 2.07
(5)
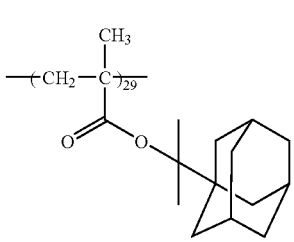
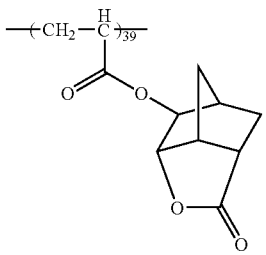
(7)
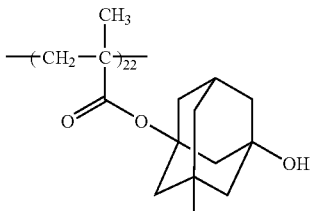
Mw = 8700
Mw/Mn = 1.98

-continued
(8)
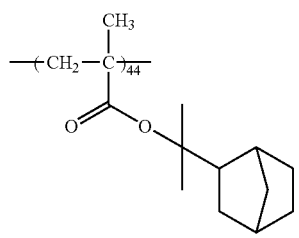
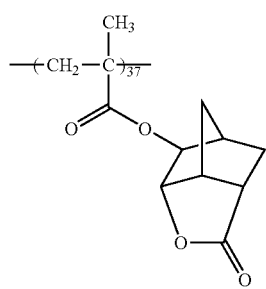
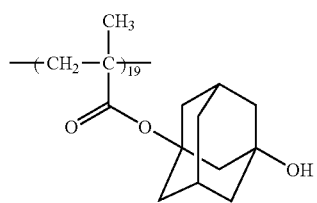
Mw = 10300
Mw/Mn = 2.16
(9)
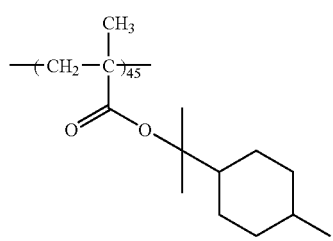
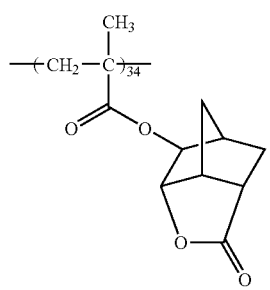
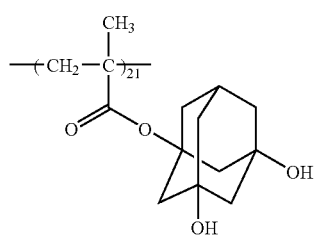
Mw = 11300
Mw/Mn = 2.21
-continued
(10)
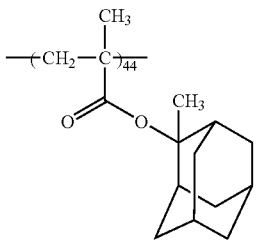
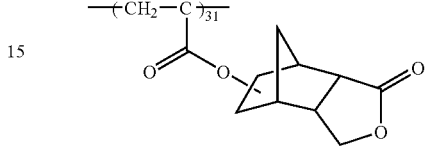
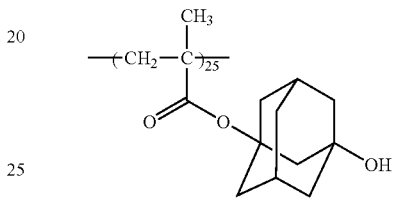
Mw = 8300
Mw/Mn = 1.97
(11)
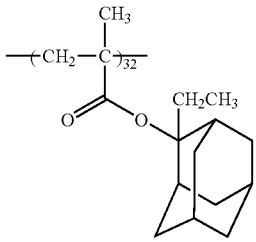
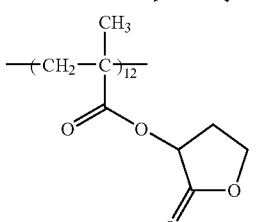
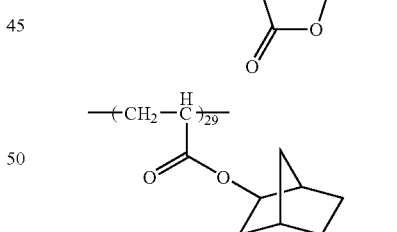
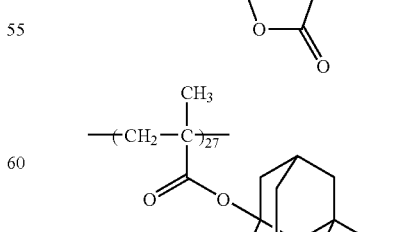
Mw = 10200
Mw/Mn = 2.31

-continued
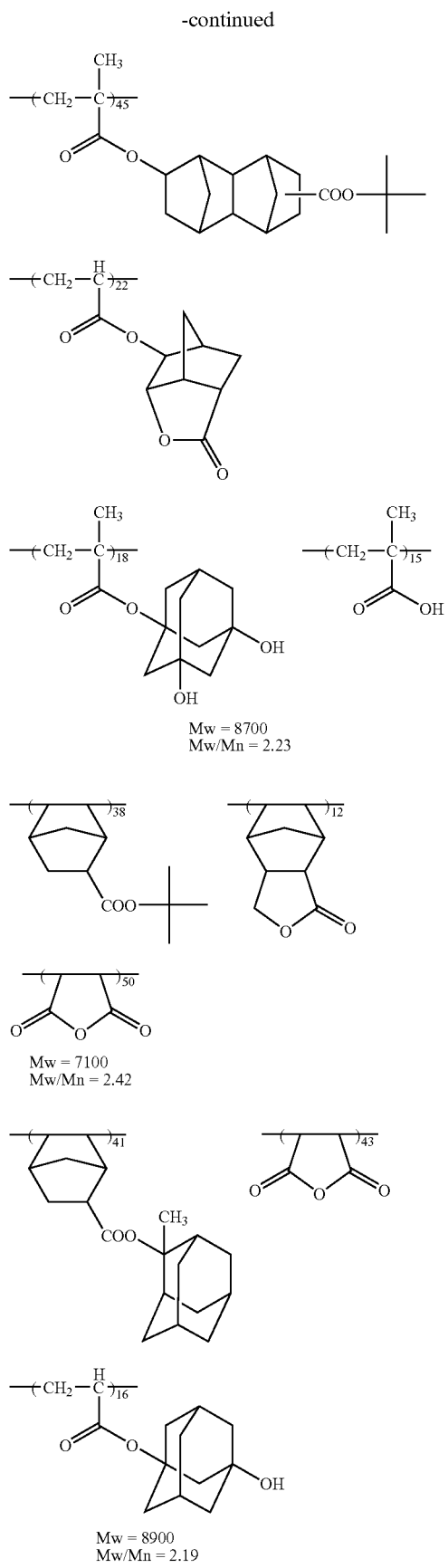
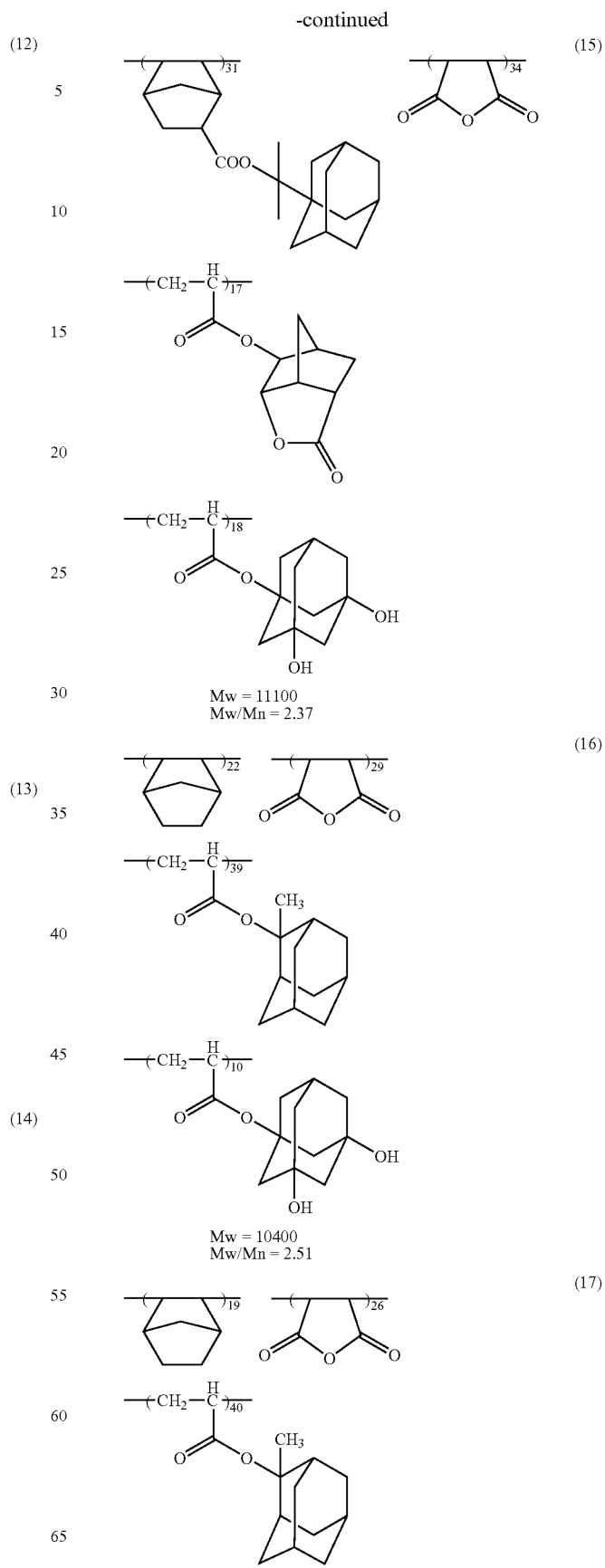

-continued

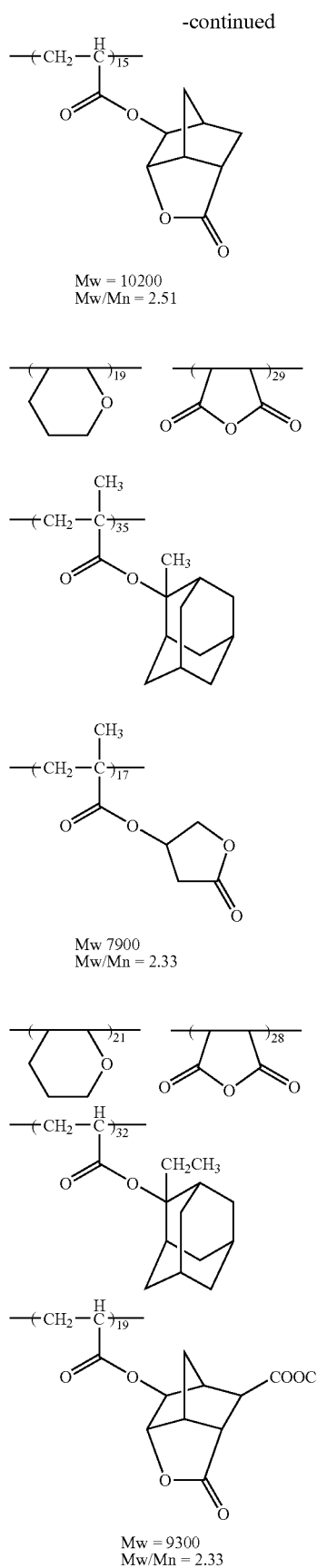

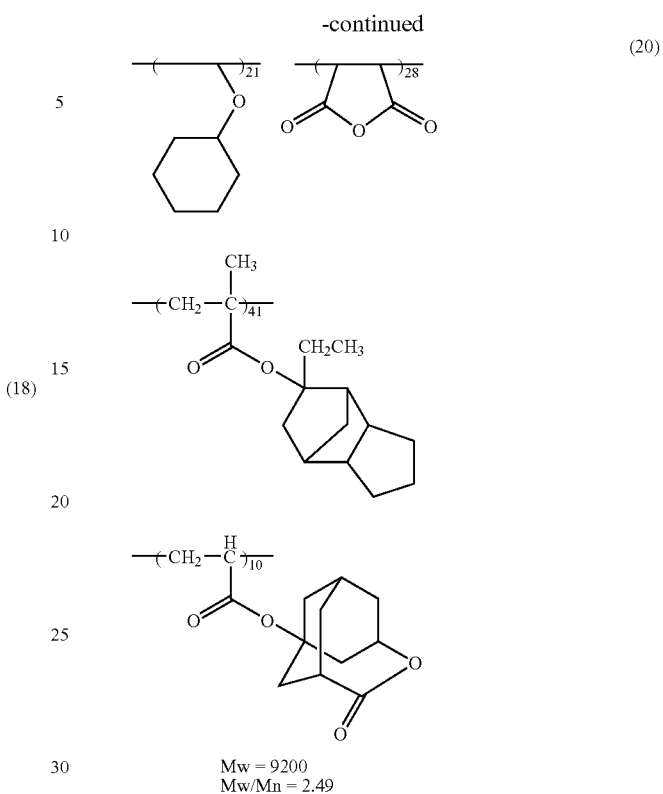

Synthesis of Alkali-Soluble Resin (D-1):

Carboxylnorbornanetrimethoxysilane (12.6 g) was added to THF, and methyltriethoxysilane (15.2 g) was added thereto. After further adding thereto hydrochloric acid (1.0 g), the obtained mixture was heated to 60° C. and in this state, the reaction was allowed to proceed for 10 hours. Subsequently, the reaction solution was neutralized with triethylamine and then charged into 2 L of distilled water to precipitate a resin. The precipitated resin was dissolved in 300 ml of ethyl acetate and then washed three times with 1 L of distilled water. The ethyl acetate was removed by an evaporator, and the residue was dried in a vacuum drier (40° C.). The weight average molecular weight of the obtained Resin (D-1) was 7,800 (by GPC, in terms of standard polystyrene in a THF solvent).

Synthesis of Alkali-Soluble Resin (D-2):

Aminomethyltrimethoxysilane (15.1 g) and nanofluorobutanesulfonic acid chloride (32.0 g) were added to THF, and triethylamine (12.0 g) was added thereto and reacted at room temperature for 3 hours. After confirming the consumption of aminomethylmethoxysilane, methyltriethoxysilane (15.2 g) was added, and hydrochloric acid (1.0 g) was further added thereto. The obtained mixture was heated to 60° C. and in this state, the reaction was allowed to proceed for 10 hours. Subsequently, the reaction solution was neutralized with triethylamine and then charged into 2 L of distilled water to precipitate a resin. The precipitated resin was dissolved in 300 ml of ethyl acetate and then washed three times with 1 L of distilled water. The ethyl acetate was removed by an evaporator, and the residue was dried in a vacuum drier (40° C.). The weight average molecular weight of the obtained Resin (D-2) was 8,400 (by GPC, in terms of standard polystyrene in a THF solvent).

Examples 1 to 20 and Comparative Examples 1 to 4

<Preparation of Resist>

<Preparation of Resist>

The components shown in Table 1 below were dissolved in a solvent to prepare a solution having a solid content concentration of 10 mass %, and the obtained solution was filtered through a 0.1-μm polyethylene filter to prepare a positive resist solution for immersion exposure. The positive resist solutions for immersion exposure prepared were evaluated by the following methods, and the results are shown in Table 1. With respect to each component, the ratio when using a plurality of species is a mass ratio.

An organic antireflection film ARC29A (produced by Nissan Chemical Industries, Ltd.) was coated on a silicon wafer and baked at 205° C. for 60 seconds to form a 78-nm antireflection film, and the positive resist composition for immersion exposure prepared above was coated thereon and baked at 120° C. for 60 seconds to form a 150-nm resist film. The thus-obtained wafer was subjected to two-beam interference exposure using pure water as the immersion liquid by an apparatus shown in FIG. 1 (wet exposure). The wavelength of the laser used was 193 nm, and a prism of forming a 90-nm line-and-space pattern was used. Immediately after the exposure, the resist film was heated at 125° C. for 90 seconds, developed with an aqueous tetramethylammonium hydroxide solution (2.38 mass %) for 60 seconds, rinsed with pure water and spin-dried to obtain a resist pattern.

In the apparatus shown in FIG. 1, 1 is a laser, 2 is a diaphragm, 3 is a shutter, 4, 5 and 6 each is a reflecting mirror, 7 is a condenser lens, 8 is a prism, 9 is an immersion liquid, 10 is a wafer having provided thereon an antireflection film and a resist film, and 11 is a wafer stage.

<Evaluation Methods>

[Development Defect]

The resist pattern obtained above was measured on the number of development defects by using Model KLA-2360 manufactured by KLA-Tencor Corporation, and the obtained primary data value was used as the measurement result.

[Scum]

The degree of development residue (scum) remaining in the 90 nm line-width resist pattern obtained above was observed by using a scanning electron microscope (S-9260, manufactured by Hitachi, Ltd.), and the scum was rated A when not observed, rated C when significantly observed, or rated B when intermediate therebetween.

[Elution Amount of Generated Acid]

The resist composition prepared was coated on 10 sheets of a 8-inch silicon wafer and baked at 115° C. for 60 seconds to form a 150 nm-thick resist film. Subsequently, the entire surface of the 8-inch wafer was exposed with light of 30 Jm/cm² by using an ArF excimer laser exposure machine (PAS5500/1100, manufactured by ASML), and this wafer was immersed in a quartz vessel containing 120 ml of pure water deionized by using an ultrapure water producing apparatus (Milli-QJr., manufactured by Nihon Millipore Ltd.), followed by sampling an effluent into water. In order to facilitate the detection by increasing the effluent concentration, this effluent sampling was repeatedly performed for 10 sheets of wafer. The thus-obtained immersion liquid after exposure was analyzed by LC-MS, and the acid eluted into the immersion liquid was quantitatively determined. The LC-MS analysis conditions were as follows.

| | |
|---|---|
| LC Apparatus: | 2695 manufactured by Waters |
| LC Conditions: | elution at a flow rate of 0.2 mL/min, column temperature: 30° C., flow solvent: a mixed solvent of methanol of 0.02 M ammonium acetate/water (=85/15) |
| LC Column used: | Mightysil RP-18 manufactured by Kanto Chemical Co., Inc. (reverse phase system, diameter: 2 mm, length: 150 mm) |
| MS Apparatus: | esquire 3000plus manufactured by Bruker Daltonics |
| MS Conditions: | nega-MS, ionization method: ESI, ion source temperature: 350° C., capillary voltage: 4.1 kV |

The detection intensity of anion species of the photoacid generator

TABLE 1

| | | (B) Resin (2 g) | (A) Photoacid Generator (mg) | Catalyst (by mass) | Surfactant (5 mg) | Dissolution Inhibiting Compound (g) | (C) Alkali-Soluble Resin (30 mg) | Number of Defects | Scum | Elution Ratio (%) |
|---|---|---|---|---|---|---|---|---|---|---|
| Example | 1 | 1 | z2 (20) | SL-4/SL-6 (60/40) | W-1 | — | (D-1) | 430 | A | 0.6 |
| | 2 | 2 | z2 (24) | SL-2/SL-4 (50/50) | W-1 | — | (D-1) | 410 | A | 0.6 |
| | 3 | 3 | z6 (28) | SL-1/SL-4/SL-8 (40/58/2) | W-1 | — | (D-2) | 420 | B | 0.7 |
| | 4 | 4 | z1 (20) | SL-2/SL-4 (40/60) | W-1 | — | (D-1) | 460 | A | 0.8 |
| | 5 | 5 | z2 (20) | SL-2/SL-4 (40/60) | — | — | (D-2) | 400 | A | 0.5 |
| | 6 | 6 | z6 (20) | SL-2/SL-4/SL-9 (40/59/1) | W-1 | — | (D-2) | 420 | B | 0.7 |
| | 7 | 7 | z6 (20) z9 (15) | SL-2/SL-4 (50/50) | W-1 | — | (D-3) | 460 | A | 0.8 |
| | 8 | 8 | z38 (20) | SL-2/SL-6 (70/30) | W-1 | — | (D-4) | 360 | B | 1.2 |
| | 9 | 9 | z2 (30) | SL-2/SL-4/SL-9 (40/59/1) | W-1 | — | (D-3) | 360 | A | 0.8 |
| | 10 | 10 | z2 (25) | SL-2/SL-4 (40/60) | W-1 | — | (D-3) | 400 | B | 0.8 |
| | 11 | 11 | z38 (12) z2 (25) | SL-2/SL-4 (40/60) | W-1 | — | (D-3) | 330 | A | 0.7 |
| | 12 | 12 | z6 (12) z31 (10) | SL-2/SL-4 (40/60) | W-1 | — | (D-4) | 270 | A | 0.7 |
| | 13 | 13 | z6 (22) z25 (10) | SL-1/SL-7 (40/60) | W-1 | 1-1 (0.1) | (D-3) | 280 | A | 0.6 |
| | 14 | 14 | z2 (32) | SL-4/SL-6 (60/40) | W-1 | — | (D-1) | 320 | A | 0.7 |
| | 15 | 15 | z38 (40) | SL-3/SL-7 (60/40) | W-1 | — | (D-1) | 430 | A | 0.7 |

TABLE 1-continued

| | | (B) Resin (2 g) | (A) Photoacid Generator (mg) | Catalyst (by mass) | Surfactant (5 mg) | Dissolution Inhibiting Compound (g) | (C) Alkali-Soluble Resin (30 mg) | Number of Defects | Scum | Elution Ratio (%) |
|---|---|---|---|---|---|---|---|---|---|---|
| | 16 | 16 | z3 (33) | SL-2/SL-5 (60/40) | W-1 | — | (D-1) | 410 | A | 0.6 |
| | 17 | 17 | z2 (50) | SL-2/SL-7 (60/40) | W-1 | 1-2 (0.1) | (D-4) | 350 | B | 1.3 |
| | 18 | 18 | z38 (27) | SL-2/SL-7 (60/40) | W-1 | — | (D-3) | 280 | A | 0.6 |
| | 19 | 19 | z6 (29) | SL-2/SL-7 (60/40) | W-1 | — | (D-1)/(D-2) (80/20) | 310 | A | 0.8 |
| | 20 | 20 | z3 (25) | SL-2/SL-4 (40/60) | W-1 | — | (D-3) | 300 | A | 0.8 |
| Comparative | 1 | 1 | z2 (24) | SL-4/SL-6 (60/40) | — | — | W-2 | 650 | C | 3.0 |
| Example | 2 | 2 | z2 (24) | SL-2/SL-4 (60/40) | — | — | — | 670 | C | 3.2 |

Symbols in Table 1 are as follows.

Acid generators are corresponding to those set forth above.

SL-1: cyclopentanone

SL-2: cyclohexanone

SL-3: 2-methylcyclohexanone

SL-4: propylene glycol monomethyl ether acetate

SL-5: ethyl lactate

SL-6: propylene glycol monomethyl ether

SL-7: 2-heptanone

SL-8: γ-butyrolactone

SL-9: propylene carbonate

W-1: Megafac F176 (produced by Dainippon Ink & Chemicals, Inc.) (fluorine-containing)

W-2: polysiloxane polymer KP-341 (produced by Shin-Etsu Chemical Co., Ltd.) (silicon-containing, insoluble in alkali developer)

I-1: tert-butyl lithocholate

I-2: tert-butyl adamantanecarboxylate

[Alkali-Soluble Siloxane Compound]

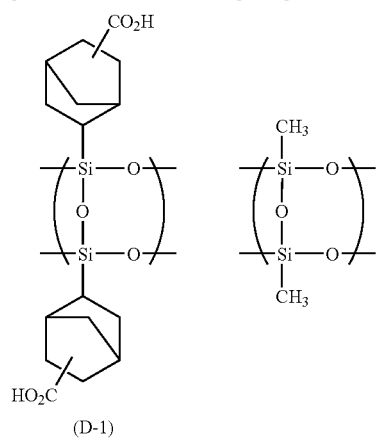

(D-1)

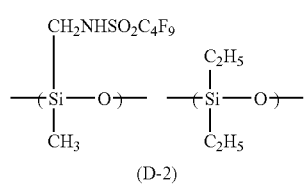

(D-2)

TABLE 1-continued

| | Composition | | | | | | Evaluation | | |
|---|---|---|---|---|---|---|---|---|---|
| | | | | | Dissolution | | | | |
| (B) Resin (2 g) | (A) Photoacid Generator (mg) | Catalyst (by mass) | Surfactant (5 mg) | Inhibiting Compound (g) | (C) Alkali-Soluble Resin (30 mg) | Number of Defects | Scum | Elution Ratio (%) |

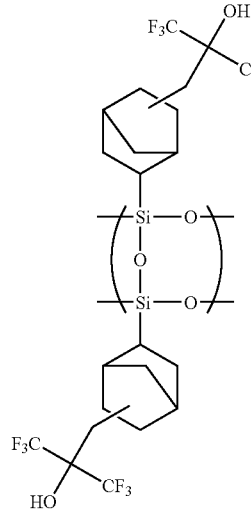

(D-3)

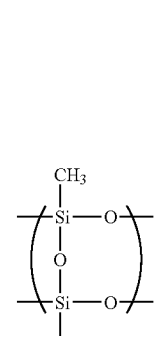

(D-4)

As seen from the results in Table 1, the positive resist composition for immersion exposure of the present invention ensures that at the immersion exposure, the number of development defects and the scum are reduced and the elution into the immersion liquid is suppressed.

This application is based on Japanese Patent application JP 2005-276529, filed Sep. 22, 2005, the entire content of which is hereby incorporated by reference, the same as if set forth at length.

What is claimed is:

1. A positive resist composition, comprising:
   (A) a compound capable of generating an acid upon irradiation with actinic rays or radiation;
   (B) a resin having a repeating unit containing at least one alicyclic structure, of which solubility in an alkali developer increases under an action of an acid; and
   (C) an alkali-soluble resin having a siloxane bond as a main chain;
   wherein the alkali-soluble resin (C) is present in the amount from 0.1 to 10 mass % based on the entire solids content of the resist composition.

2. The positive resist composition as claimed in claim 1, wherein the alkali-soluble resin (C) has a group containing a fluorine atom in a side chain of the alkali-soluble resin (C).

3. The positive resist composition as claimed in claim 2, wherein in the alkali-soluble resin (C), the fluorine atom is present as a substituent on the carbon atom bonded by a hydroxyl group or as a substituent on the carbon atom adjacent to the carbon atom bonded by a hydroxyl group.

4. The positive resist composition as claimed in claim 1, further comprising: (D) an organic solvent.

5. The positive resist composition as claimed in claim 1, further comprising: (E) an organic basic compound.

6. The positive resist composition as claimed in claim 1, further comprising: (F) a dissolution inhibiting compound.

7. The positive resist composition as claimed in claim 1, further comprising: (G) a surfactant.

8. The positive resist composition as claimed in claim 1, further comprising: (H) an alkali-soluble resin.

9. The positive resist composition as claimed in claim 1, further comprising: (I) an onium carboxylate.

10. A pattern forming method comprising: forming a resist film from the resist composition claimed in claim 1; immersion exposing the resist film; and developing the resist film.

11. The positive resist composition as claimed in claim 1, wherein the alkali soluble resin (C) has an alkali soluble group or a group capable of being solubilized by undergoing hydrolysis with an alkali developer.

12. The positive resist composition as claimed in claim 11, wherein the alkali soluble resin (C) has an alkali-soluble group selected from the group consisting of a phenolic hydroxyl group, a carboxylic acid group, a fluorinated alcohol group, a sulfonic acid group, a sulfonamide group, and an active methylene group-containing group.

13. The positive resist composition as claimed in claim 12, wherein the alkali soluble resin (C) has an active methylene group-containining group selected from the group consisting of $-C(=O)-CH_2-C(=O)-$, $-C(=O)CHR-C(=O)-$, $-C(=O)-CH(C(=O))_2$, and $-SO_2-CH_2-C(=O)-$; and, wherein R is an alkyl group.

14. The positive resist composition as claimed in claim 11, wherein the alkali soluble resin (C) has a group capable of being solubilized by undergoing hydrolysis with an alkali developer selected from the group consisting of a lactone group, an ester group, a sulfonamide group, and an acid anhydride.

* * * * *